US012317648B2

(12) United States Patent
Lee et al.

(10) Patent No.: US 12,317,648 B2
(45) Date of Patent: May 27, 2025

(54) DISPLAY DEVICE

(71) Applicant: Samsung Display Co., LTD., Yongin-si (KR)

(72) Inventors: Jong Chan Lee, Suwon-si (KR); Tae Hee Lee, Asan-si (KR); Woong Hee Jeong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 822 days.

(21) Appl. No.: 17/462,737

(22) Filed: Aug. 31, 2021

(65) Prior Publication Data

US 2022/0069167 A1 Mar. 3, 2022

(30) Foreign Application Priority Data

Sep. 3, 2020 (KR) ........................ 10-2020-0112327

(51) Int. Cl.
*H10H 20/831* (2025.01)
*H10H 20/851* (2025.01)
(Continued)

(52) U.S. Cl.
CPC .... *H10H 20/8316* (2025.01); *H10H 20/8312* (2025.01); *H10H 20/8512* (2025.01); *H10H 20/857* (2025.01); *H10H 29/142* (2025.01)

(58) Field of Classification Search
CPC .............................. H01L 33/62; H01L 27/156
See application file for complete search history.

(56) References Cited

U.S. PATENT DOCUMENTS 6,653,661 B2 * 11/2003 Okazaki ................. H01L 24/97
257/E33.059
2014/0159043 A1 * 6/2014 Sakariya ............. H01L 25/0753
438/34
(Continued)

FOREIGN PATENT DOCUMENTS

KR  10-2019-0029831  3/2019
KR  10-2020-0001649  1/2020
(Continued)

OTHER PUBLICATIONS

International Search Report corresponding to International Application No. PCT/KR2021/011760 dated Dec. 9, 2021.
(Continued)

*Primary Examiner* — Vincent Wall
(74) *Attorney, Agent, or Firm* — KILE PARK REED & HOUTTEMAN PLLC

(57) ABSTRACT

A display device includes a substrate including first areas and second areas, active layers disposed on the substrate in the second areas, a first conductive layer including first gate electrodes, a first interlayer insulating layer disposed on the first conductive layer and the substrate, a second conductive layer including first and second electrodes which are disposed in each of the first areas to be spaced apart from each other, a second interlayer insulating layer disposed on the second conductive layer and the first interlayer insulating layer, a third conductive layer including source electrodes and drain electrodes which are disposed on the second interlayer insulating layer in the second areas, a via layer disposed on the third conductive layer in the second areas and exposing the first areas and light-emitting elements disposed on the second interlayer insulating layer in each of the first areas.

20 Claims, 23 Drawing Sheets

(51) Int. Cl.
    *H10H 20/857*     (2025.01)
    *H10H 29/14*     (2025.01)

(56) References Cited

U.S. PATENT DOCUMENTS

| | | | |
|---|---|---|---|
| 2019/0115513 A1* | 4/2019 | Im | H05K 1/111 |
| 2019/0214376 A1* | 7/2019 | Kim | H01L 33/504 |
| 2021/0288217 A1 | 9/2021 | Li et al. | |
| 2021/0288220 A1 | 9/2021 | Oh et al. | |
| 2021/0327954 A1 | 10/2021 | Cho et al. | |

FOREIGN PATENT DOCUMENTS

| | | |
|---|---|---|
| KR | 10-2020-0004936 | 1/2020 |
| KR | 10-2020-0005692 | 1/2020 |
| KR | 10-2020-0010685 | 1/2020 |
| KR | 10-2020-0010701 | 1/2020 |
| KR | 10-2020-0010704 | 1/2020 |
| KR | 10-2020-0038342 | 4/2020 |
| KR | 10-2020-0086790 | 7/2020 |

OTHER PUBLICATIONS

Written Opinion corresponding to International Application No. PCT/KR2021/011760 dated Dec. 9, 2021.

* cited by examiner

DISPLAY DEVICE

CROSS-REFERENCE TO RELATED APPLICATION(S)

This application claims priority to and the benefit of Korean Patent Application No. 10-2020-0112327 under 35 U.S.C. § 119 filed on Sep. 3, 2020 in the Korean Intellectual Property Office (KIPO), the entire contents of which are incorporated herein by reference.

BACKGROUND

1. Technical Field

The disclosure relates to a display device.

2. Description of the Related Art

Display devices are becoming more important with developments in multimedia technology. Accordingly, various display devices such as a liquid crystal display (LCD) device, an organic light-emitting diode (OLED) display device, and the like have been used.

A typical display device includes a display panel for displaying an image, such as an OLED display panel or an LCD panel. A light-emitting display panel, which is a type of display panel, may include light-emitting elements such as, for example, light-emitting diodes (LEDs). The LEDs may be classified into OLEDs using an organic material as a fluorescent material and inorganic LEDs (ILEDs) using an inorganic material as a fluorescent material.

SUMMARY

Embodiments of the disclosure provide a display device including inorganic light-emitting elements.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, a display device may comprise a substrate including a plurality of first areas and a plurality of second areas, at least one of the plurality of second areas being disposed between adjacent ones of the plurality of first areas, active layers disposed on the substrate in the plurality of second areas, a first conductive layer including first gate electrodes which are disposed on the active layers, a first interlayer insulating layer disposed on the first conductive layer and the substrate, a second conductive layer including a first electrode and a second electrode which are disposed in each of the plurality of first areas and are spaced apart from each other, a second interlayer insulating layer disposed on the second conductive layer and the first interlayer insulating layer, a third conductive layer including source electrodes and drain electrodes which are disposed on the second interlayer insulating layer in the plurality of second areas, a via layer disposed on the third conductive layer in the plurality of second areas and exposing the plurality of first areas, and a plurality of light-emitting elements disposed on the second interlayer insulating layer in each of the plurality of first areas, each of the plurality of light-emitting elements including end portions disposed on the first and second electrodes.

The via layer may surround the plurality of first areas, and the plurality of light-emitting elements may not overlap portions of the first and third conductive layers in the plurality of second areas in a thickness direction of the substrate.

The display device may further comprise a reflective layer disposed on side surfaces of the via layer and surrounding the plurality of first areas.

The reflective layer may be disposed on the second interlayer insulating layer and may not be electrically connected to the first and second electrodes.

The display device may further comprise a first contact electrode electrically contacting the first electrode and first end portions of the plurality of light-emitting elements; and a second contact electrode electrically contacting the second electrode and second end portions of the plurality of light-emitting elements, wherein the first and second contact electrodes may be disposed on the second interlayer insulating layer in each of the plurality of first areas.

The first contact electrode may be formed in each of the plurality of first areas and electrically contact the first electrode through a first contact hole that penetrates the second interlayer insulating layer, and the second contact electrode may be formed in each of the plurality of first areas and electrically contact the second electrode through a second contact hole that penetrates the second interlayer insulating layer.

The display device may further comprise a first insulating layer disposed on the plurality of light-emitting elements and exposing both end portions of each of the plurality of light-emitting elements; and a second insulating layer disposed on the first contact electrode, wherein a first side of the first contact electrode may be disposed directly on the first insulating layer, and a first side of the second contact electrode may be disposed directly on the second insulating layer.

The second conductive layer may include capacitive electrodes which are disposed in the plurality of second areas and overlap the first gate electrodes in the thickness direction of the substrate.

The via layer may include a first via layer which is disposed directly on the second interlayer insulating layer, and a second via layer which is disposed on the first via layer, and the display device may further comprise a fourth conductive layer, the fourth conductive layer including first voltage lines which are disposed on the first via layer and are electrically connected to the first electrode, and second voltage lines which are electrically connected to the second electrode.

The first electrode may electrically contact a first conductive pattern which is disposed in the third conductive layer and is electrically connected to the source electrodes through a first electrode contact hole that penetrates the second interlayer insulating layer, and the second electrode may electrically contact a second conductive pattern which is disposed in the third conductive layer and is electrically connected to the second voltage lines through a second electrode contact hole that penetrates the second interlayer insulating layer.

The display device may further comprise a plurality of color control structures disposed on the plurality of light-emitting elements in different first areas, wherein each of the plurality of color control structures may include a light-transmitting layer which is disposed in one of the plurality of first areas, and a first wavelength conversion layer which is disposed in another first area adjacent to the first area in which the light-transmitting layer is disposed.

The display device may further comprise a first color filter layer disposed on the light-transmitting layer, a second color filter layer disposed on the first wavelength conversion layer and spaced apart from the first color filter layer; and a first light-blocking member disposed on the via layer in the plurality of second areas.

Each of the plurality of color control structures may include a second wavelength conversion layer, which is disposed in the another first area adjacent to the first area where the first wavelength conversion layer is disposed, and the display device may further comprise a third color filter layer which is disposed on the second wavelength conversion layer.

The display device may further comprise a color film disposed on a bottom surface of the substrate, wherein the color filter may include a fourth color filter layer which is disposed in the first area where the light-transmitting layer is disposed, a fifth color filter layer which is disposed in the first area where the first wavelength conversion layer is disposed, and a sixth color filter layer which is disposed in the first area where the second wavelength conversion layer is disposed.

The plurality of light-emitting elements may include first light-emitting elements which are disposed in one of the plurality of first areas, and second light-emitting elements which are disposed in another first area adjacent to the first area where the first light-emitting elements are disposed, and the first light-emitting elements and the second light-emitting elements may emit light of different colors.

According to an embodiment of the disclosure, a display device comprises a substrate, a via layer disposed on the substrate extending in a first direction and a second direction which intersects the first direction, and surrounding a plurality of first areas, first transistors disposed in a plurality of second areas in which the via layer is disposed, a first electrode and a second electrode disposed in each of the plurality of first areas, extending in the second direction, and spaced apart from each other in the first direction, a plurality of light-emitting elements disposed on the first and second electrodes, a first contact electrode disposed on the first electrode and electrically contacting first end portions of the plurality of light-emitting elements, a second contact electrode disposed on the second electrode and electrically contacting second end portions of the plurality of light-emitting elements, and a reflective layer surrounding the plurality of first areas and disposed on inner sides of the via layer.

The plurality of light-emitting elements may not overlap the first transistors which are disposed in the plurality of second areas in a thickness direction of the substrate.

The display device may further comprise first voltage lines and second voltage lines disposed in the plurality of second areas, wherein the first and second electrodes may do not overlap the first voltage lines and the second voltage lines in the thickness direction of the substrate.

The display device may further comprise a color control structure disposed in each of the plurality of first areas and overlapping the plurality of light-emitting elements, the color control structure including a light-transmitting layer which is disposed in one of the plurality of first areas, and a first wavelength conversion layer which is disposed in another first area adjacent to the first area where the light-transmitting layer is disposed.

The display device may further comprise third areas spaced apart from the plurality of first areas in the second direction and surrounded by the via layer, wherein the first and second electrodes may extend in the second direction and be disposed in portion in the third areas, and the light-emitting elements may not be disposed in the third areas.

According to the aforementioned and other embodiments of the disclosure, since a region in which light-emitting elements are disposed and a region in which circuit elements are disposed are separated, a double-sided light-emitting display device capable of outputting light emitted by the light-emitting elements through both the top surface and the bottom surface of a substrate at the same time can be implemented.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as being limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that, although the terms "first," "second," or the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described with reference to the attached drawings.

Figure 1:
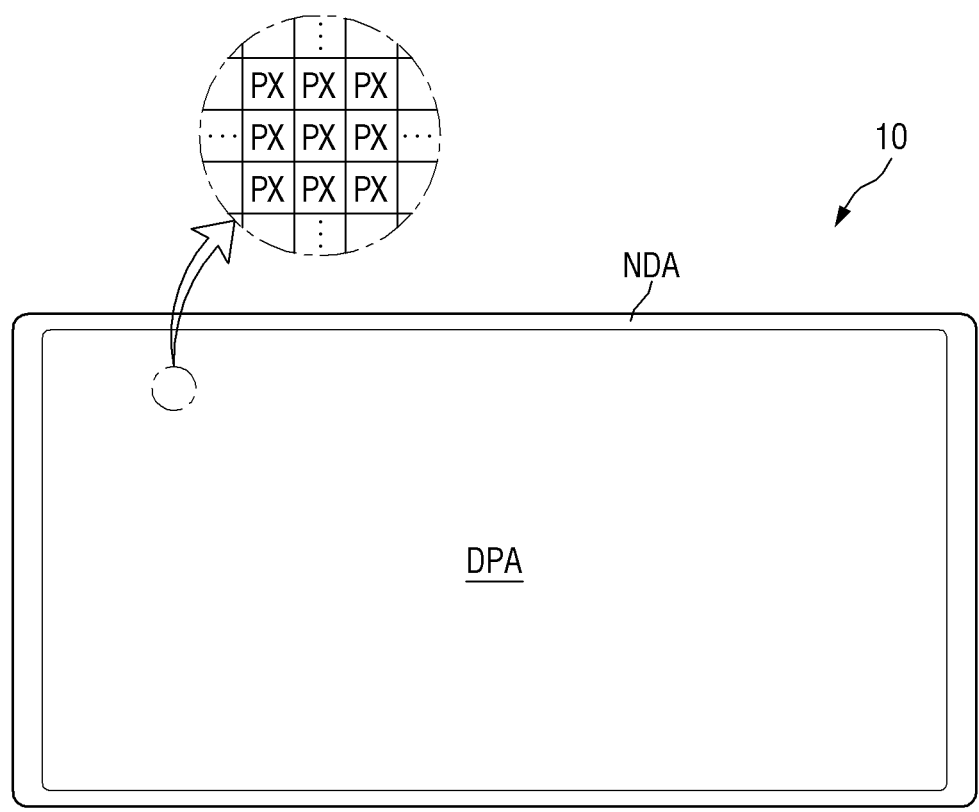
FIG. 1 is a schematic plan view of a display device according to an embodiment of the disclosure.

FIG. 1 is a schematic plan view of a display device according to an embodiment.

Referring to FIG. 1, a display device 10 may display a moving or still image. The display device 10 may refer to nearly all types of electronic devices that provide a display screen. Examples of the display device 10 may include a television (TV), a laptop computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, or the like.

The display device 10 may include a display panel that provides a display screen. Examples of the display panel of the display device 10 may include an inorganic light-emitting diode (ILED) display panel, an organic light-emitting diode (OLED) display panel, a quantum-dot light-emitting diode (QLED) display panel, a plasma display panel (PDP), a field-emission display (FED) panel, or the like. The display panel of the display device 10 will hereinafter be described as being, for example, an ILED display panel, but the disclosure is not limited thereto. For example, various other display panels may also be applicable to the display panel of the display device 10.

The shape of the display device 10 may vary. For example, the display device 10 may have a rectangular shape, a square shape, a tetragonal shape with rounded corners, a non-tetragonal polygonal shape, a circular shape, or etc. The shape of a display area DPA of the display device 10 may be similar to the shape of the display device 10. FIG. 1 illustrates that the display device 10 and the display area DPA both have a rectangular shape that extends longer in the horizontal direction than in the vertical direction.

The display device 10 may include the display area DPA and a non-display area NDA. The display area DPA may be an area in which an image is displayed, and the non-display area NDA may be an area in which an image is not displayed. The display area DPA may also be referred to as an active area, and the non-display area NDA may also be referred to as an inactive area. The display area DPA may occupy the middle or center portion of the display device 10.

The display area DPA may include pixels PX. The pixels PX may be arranged in row and column directions. The pixels PX may have a rectangular or square shape in a plan view, but the disclosure is not limited thereto. As another example, the pixels PX may have a rhombic shape having sides that are inclined with respect to a particular direction. The pixels PX may be alternately arranged in a stripe fashion or a PenTile® fashion. Each of the pixels PX may include one or more light-emitting elements ED, which emit light of a particular wavelength range to display a specific color.

The non-display area NDA may be disposed around the display area DPA. The non-display area NDA may surround the entire display area DPA or portion of the display area DPA. The display area DPA may have a rectangular shape, and the non-display area NDA may be disposed adjacent to four sides of the display area DPA. The non-display area NDA may form the bezel of the display device 10. Wires or circuit drivers included in the display device 10 may be disposed in the non-display area NDA, or external devices may be mounted in the non-display area NDA.

Figure 2:
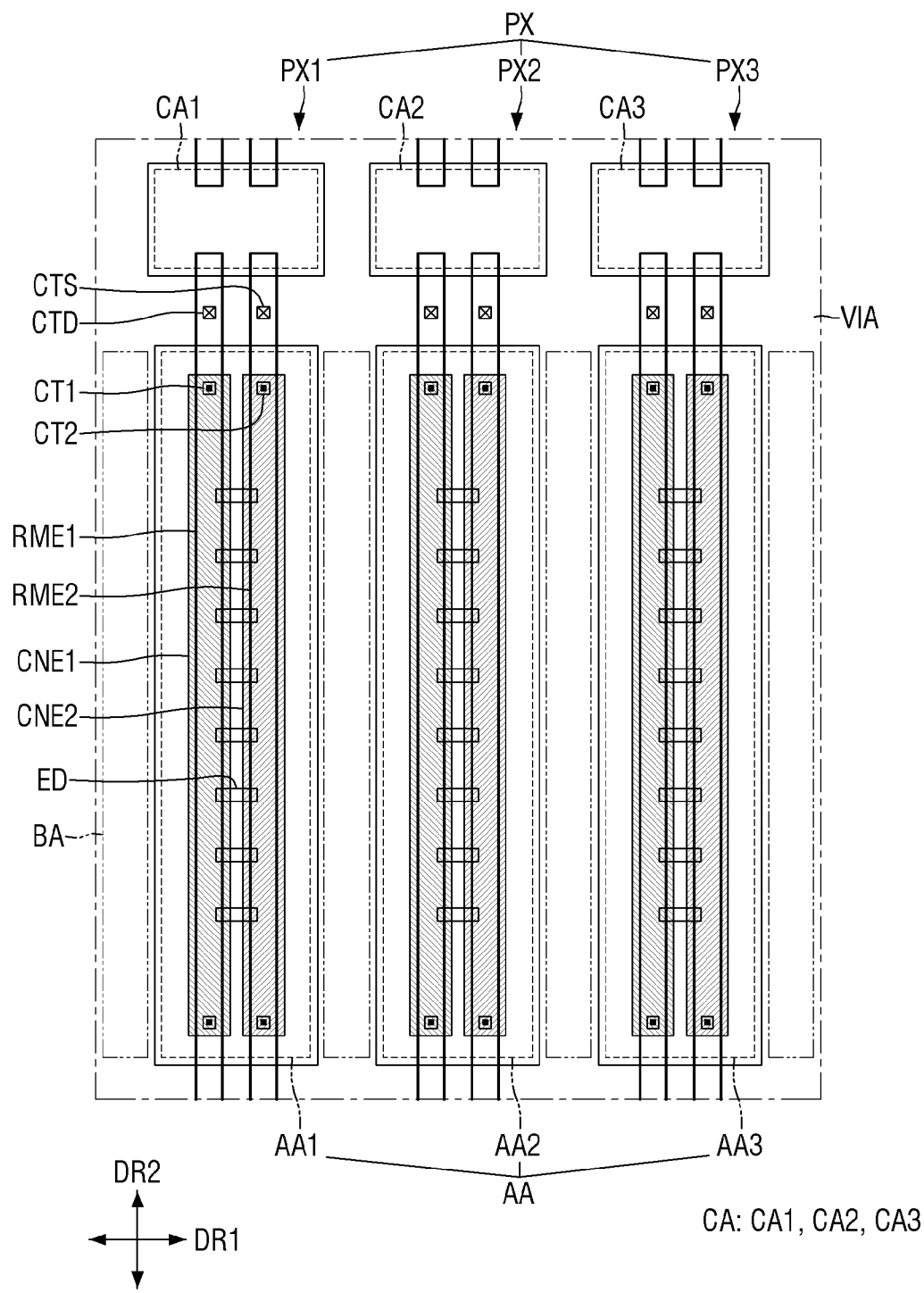
FIG. 2 is a schematic plan view of a pixel of the display device of FIG. 1.

FIG. 2 is a schematic plan view of a pixel of the display device of FIG. 1.

Referring to FIG. 2, a pixel PX may include subpixels PXn (where n is an integer of 1 to 3). For example, the pixel PX may include first, second, and third subpixels PX1, PX2, and PX3. The first, second, and third subpixels PX1, PX2, and PX3 may emit light of first, second, and third colors, respectively. For example, the first, second, and third colors may be blue, green, and red, respectively, but the disclosure is not limited thereto. As another example, the first, second, and third subpixels PX1, PX2, and PX3 may emit light of the same color. FIG. 2 illustrates that the pixel PX includes three subpixels PXn, but the disclosure is not limited thereto. For example, the pixel PX may include more than three subpixels PXn.

The pixel PX may include first areas AA (i.e., first areas AA1, AA2, and AA3 of the first, second, and third subpixels PX1, PX2, and PX3), and each of the subpixels PXn may include second areas BA and a third area CA (i.e., third areas CA1, CA2, and CA3 of the first, second, and third subpixels PX1, PX2, and PX3). The first areas AA may be emission areas that emit light of a particular wavelength range by means of light-emitting elements ED being disposed therein, and the second areas BA and the third area CA may be non-emission areas that do not emit light because the light-emitting elements ED are not disposed therein so that light emitted by the light-emitting elements ED does not arrive. The first areas AA may include regions in which the light-emitting elements ED are disposed and neighboring regions in which light emitted by the light-emitting elements ED is output.

Here, the emission areas may include the first areas AA and may also include regions in which light emitted by the light-emitting elements ED is output by being reflected or refracted by other elements. Light-emitting elements (or light-emitting diodes) ED may be disposed in each of the subpixels PXn and may form an emission area including a region in which they are disposed and a neighboring region which is adjacent to the region.

The first areas AA of the subpixels PXn may be arranged side-by-side in a direction. For example, the first areas AA1, AA2, and AA3 of the first, second, and third subpixels PX1, PX2, and PX3 may be arranged side-by-side in a first direction DR1 and may be defined by a via layer VIA. The subpixels PXn may include light-emitting elements ED of the same type so that the first areas AA1, AA2, and AA3 may emit light of the same color. For example, the subpixels PXn may include light-emitting elements ED emitting first-color light, for example, blue light, and the first areas AA1, AA2, and AA3 may all emit blue light. However, the disclosure is not limited to this example. As another example, the subpixels PXn may include different types of groups of light-emitting elements ED and may thus emit light of different colors. For example, the first subpixel PX1 may emit first-color light, for example, blue light, the second subpixel PX2 may emit second-color light, for example, green light, and the third subpixel PX3 may emit third-color light, for example, red light. The subpixels PXn will hereinafter be described as including groups of light-emitting elements ED that emit light of the same color.

Each of the subpixels PXn may include second areas BA in which the via layer VIA is disposed, as portions of the non-emission area of the pixel PX. Each of the second areas BA may be areas adjacent to first areas AA and may be disposed between the first areas AA. The second areas BA are illustrated as being formed in portions of the via layer VIA that extend in a second direction DR2, but the disclosure is not limited thereto. As another example, in some embodiments, the second areas BA may be formed not only in the region in which the via layer VIA is disposed, but also between the first areas AA and between the first areas AA and the third areas CA. In an embodiment, the display device 10 may include the second areas BA, in which circuit elements for driving the light-emitting elements ED disposed in each of the subpixels PXn are disposed. The display device 10 may be divided into areas where light-emitting elements ED are disposed and areas where circuit elements are disposed. Accordingly, light emitted by the light-emitting elements ED may be output through both the top surface and the bottom surface of a substrate at the same time, and a double-sided light-emitting display device can be realized.

The non-emission area of the pixel PX may include third areas CA (i.e., third areas CA1, CA2, and CA3 of the first, second, and third subpixels PX1, PX2, and PX3), which are spaced apart from the first areas AA. The third areas CA may be disposed on first sides, in the second direction DR2, of the first areas AA, between the first areas AA. For example, the third areas CA1, CA2, and CA3 of the first, second, and third subpixels PX1, PX2, and PX3 may be disposed on the upper sides, in the second direction DR2, of the first areas AA1, AA2, and AA3, respectively, of the first, second, and third subpixels PX1, PX2, and PX3 and may be arranged side-by-side in the first direction DR1.

Light may not be output from the third areas CA because the light-emitting elements ED are not disposed in the third areas CA, but portions of electrodes (RME1 and RME2) disposed in each subpixel PXn may be disposed in the third areas CA. The portions of electrodes (RME1 and RME2) may be disposed in the third areas CA to be separated from each other.

In a plan view, the via layer VIA may include portions extending in the first direction DR1 and portions extending in the second direction DR2 and may be arranged in a lattice pattern in the entire display area DPA. The via layer VIA may be disposed along the boundaries between the subpixels PXn to separate the neighboring subpixels PXn from each other. The via layer VIA may be disposed to surround and separate the first areas AA and the third areas CA disposed in each subpixel PXn and to overlap the second areas BA. The first areas AA and the third areas CA may substantially be opening areas in which the via layer VIA is not disposed.

Figure 3:
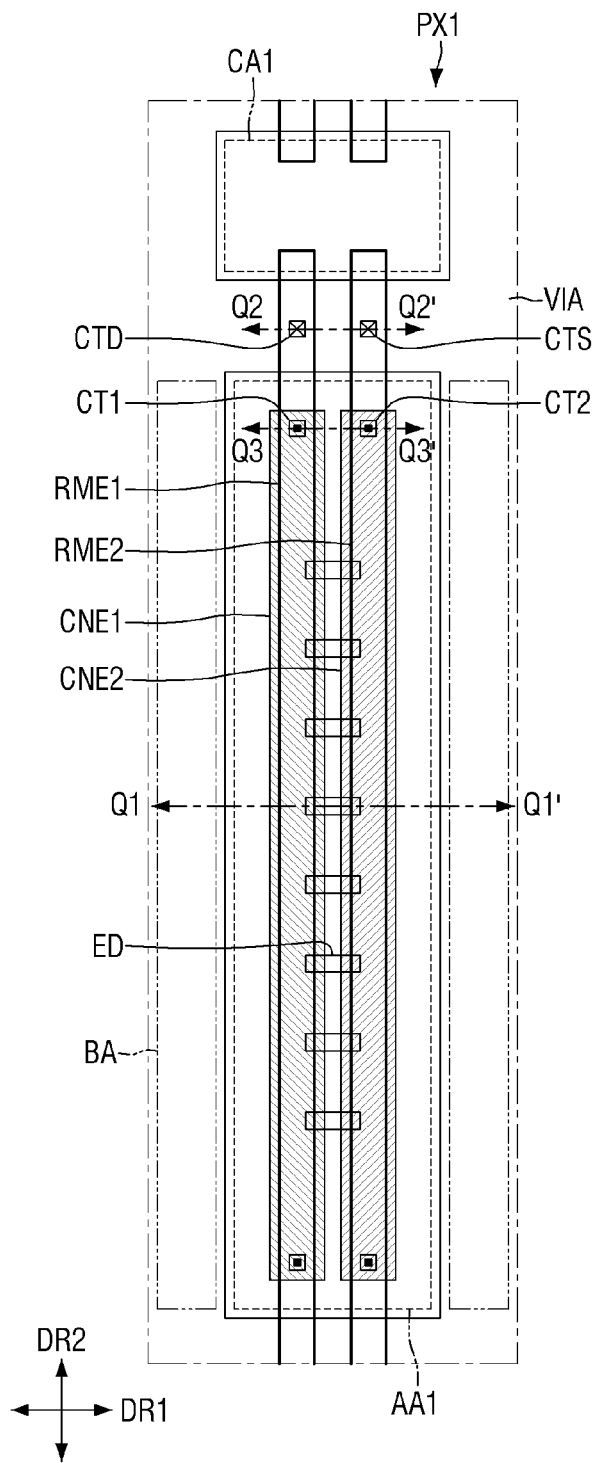
FIG. 3 is a schematic plan view of a first subpixel of FIG. 2.
Figure 4:
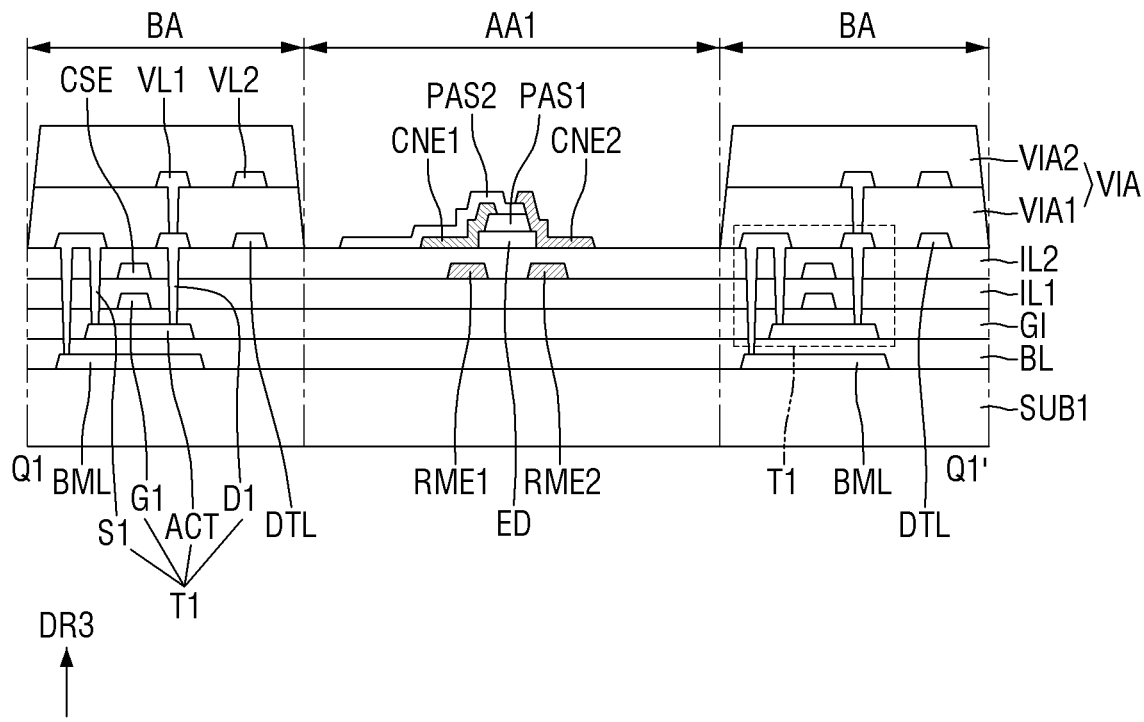
FIG. 4 is a schematic cross-sectional view taken along line Q1-Q1' of FIG. 3.
Figure 5:
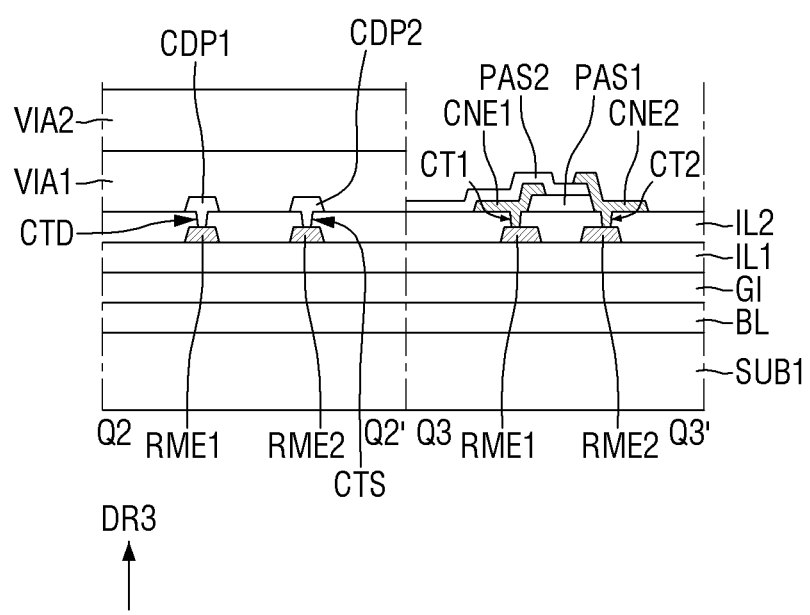
FIG. 5 is a schematic cross-sectional view taken along lines Q2-Q2' and Q3-Q3' of FIG. 3.

FIG. 3 is a schematic plan view of a first subpixel of FIG. 2. FIG. 4 is a schematic cross-sectional view taken along line Q1-Q1' of FIG. 3. FIG. 5 is a schematic cross-sectional view taken along lines Q2-Q2' and Q3-Q3' of FIG. 3. FIG. 4 illustrates a schematic cross-sectional view taken from one end portion to another end portion of a light-emitting element ED of the first subpixel PX1, along with the first area AA1 and the second areas BA of the first subpixel PX1. FIG. 5 illustrates a schematic cross-sectional view taken across electrode contact holes (CTD and CTS) and contact holes (CT1 and CT2) formed in a subpixel PXn (e.g., the first subpixel PX1).

Referring to FIGS. 2 and 3 to 5, the display device 10 may include a first substrate SUB1, conductive layers, which are disposed on the first substrate SUB1, light-emitting elements ED, and insulating layers. Some of the conductive layers may be disposed in the second areas BA to form circuitry or circuit elements for driving the light-emitting elements ED, and other conductive layers may be disposed in the first area AA1 to form electrodes or the like that are electrically connected to the light-emitting elements ED.

The first substrate SUB1 may be an insulating substrate formed of a transparent material. The first substrate SUB1 may be formed of an insulating material such as glass, quartz, or a polymer resin. The first substrate SUB1 may be a rigid substrate or may be a flexible substrate that is bendable, foldable, or rollable.

Lower metal layers BML may be disposed on the first substrate SUB1. The lower metal layers BML may be disposed to overlap first active layers ACT of first transistors T1 that will be described below. The lower metal layers BML may include a material capable of blocking the transmission of light and may prevent light from being incident upon the first active layers ACT of the first transistors T1. For example, the lower metal layers BML may be formed of an opaque metal material capable of blocking the transmission of light. The lower metal layers BML may not be disposed in the first area AA1, in which the light-emitting elements ED are disposed but may be disposed only in the second areas BA, in which circuit elements are disposed. However, the disclosure is not limited to this, and as another example, in some embodiments, the lower metal layers BML may not be provided.

A buffer layer BL may cover or overlap the lower metal layers BML and may be disposed on the first substrate SUB1. The buffer layer BL may be disposed in and across the first area AA1, the second areas BA, and the third area CA1. The buffer layer BL may be formed on the first substrate SUB1, which is susceptible to moisture, to protect the first transistors T1 from moisture that may penetrate the first substrate SUB1, and may perform a surface planarization function.

A semiconductor layer may be disposed on the buffer layer BL. The semiconductor layer may include the first active layers ACT of the first transistors T1. For example, the semiconductor layer may include polycrystalline silicon, monocrystalline silicon, or an oxide semiconductor. Here, polycrystalline silicon may be formed by crystallizing amorphous silicon. In a case where the semiconductor layer includes an oxide semiconductor, each of the first active layers ACT may include conductor regions and a channel region between the conductor regions. The oxide semiconductor may be an oxide semiconductor containing indium (In). In some embodiments, the oxide semiconductor may be indium tin oxide (ITO), indium zinc oxide (IZO), indium gallium oxide (IGO), indium zin tin oxide (IZTO), indium gallium zinc oxide (IGZO), indium gallium tin oxide (IGTO), or indium gallium zinc tin oxide (IGZTO).

As another example, the semiconductor layer may include polycrystalline silicon, which may be formed by (or include) crystallizing amorphous silicon. In this case, the conductor regions of each of the first active layers ACT may be regions doped with impurities, but the disclosure is not limited thereto.

A first gate insulating layer GI may be disposed on the semiconductor layer and the buffer layer BL. For example, the first gate insulating layer GI may be disposed to cover or overlap the top surfaces of the semiconductor layer and the buffer layer BL. The first gate insulating layer GI may function as the gate insulating film of each transistor. The first gate insulating layer GI may be disposed in the first area AA1, the second areas BA, and the third area CA1.

A first conductive layer may be disposed on the first gate insulating layer GI. The first conductive layer may include first gate electrodes G1 of the first transistors T1. Although not specifically illustrated, the first conductive layer may further include scan lines, which are electrically connected to the subpixels PXn. The first gate electrodes G1 of the first transistors T1 may be disposed to partially overlap the first active layers ACT of the first transistors T1.

A first interlayer insulating layer IL1 may be disposed on the first conductive layer. The first interlayer insulating layer IL1 may be disposed to overlap and protect the first conductive layer. The first interlayer insulating layer IL1 may be disposed in and across the first area AA1, the second areas BA, and the third area CA1.

A second conductive layer may be disposed on the first interlayer insulating layer IL1. The second conductive layer may include capacitive electrodes CSE of storage capacitors and electrodes (RME1 and RME2), which are disposed in the first area AA1.

The capacitive electrodes CSE may be disposed to overlap the first gate electrodes G1 of the first transistors T1 and may form the storage capacitors together with the first gate electrodes G1. The capacitive electrodes CSE are illustrated as being formed to have a similar width to the first gate electrodes G1, but the disclosure is not limited thereto. The capacitive electrodes CSE may be formed to have a relatively larger width, and/or the first gate electrodes G1 may also be formed to have a relatively larger width.

The electrodes (RME1 and RME2) may extend in a direction and may be disposed in each of the subpixels PXn to be spaced apart from each other. For example, in a subpixel PXn, first and second electrodes RME1 and RME2 may be disposed to extend in the second direction DR2 and be spaced apart from each other in the first direction DR1.

The first and second electrodes RME1 and RME2 may be disposed in the first area AA (e.g., the first area AA1) to extend to the third area CA (e.g., the third area CA1) and may be spaced apart from other electrodes (RME1 and RME2) of a neighboring subpixel PXn, in the second direction DR2, of the subpixel PXn, in the third area CA. The electrodes (RME1 and RME2) may be obtained by forming single electrode lines that extend in the second direction DR2 across multiple pixels PX and removing portions of the electrode lines in the third areas CA of each of the multiple pixels PX. For example, portions of the electrodes (RME1 and RME2) may be disposed on and near the boundaries with neighboring pixels PX, in the second direction DR2, of the pixel PX of FIG. 2.

The electrodes (RME1 and RME2) may be used to form an electric field in the subpixel PXn to align the light-emitting elements ED during the fabrication of the display device 10. The light-emitting elements ED may receive a dielectrophoretic force from the electric field formed on the electrodes (RME1 and RME2) and may thereby be aligned on the electrodes (RME1 and RME2). The electrodes (RME1 and RME2) may be electrically connected to the light-emitting elements ED to transmit electrical signals for causing the light-emitting elements ED to emit light.

The first and second electrodes RME1 and RME2 may partially overlap the via layer VIA that will be described below. The via layer VIA may be formed to surround the first area AA and the third area CA, and the electrodes (RME1 and RME2) may overlap portions of the via layer VIA that extend in the first direction DR1. The first and second electrodes RME1 and RME2 may electrically contact conductive patterns (CDP1 and CDP2), which are disposed in a third conductive layer, via the electrode contact holes (CTD and CTS), which penetrate a second interlayer insulating layer IL2 above the first and second electrodes RME1 and RME2, in a region that overlaps the via layer VIA. The first electrode RME1 may electrically contact a first conductive pattern CDP1 via a first electrode contact hole CTD and may thus be electrically connected to the first transistors T1. The second electrode RME2 may electrically contact a second conductive pattern CDP2, which is disposed in the third conductive layer, via a second electrode contact hole CTS and may thus be electrically connected to second voltage lines VL2. As the first and second electrodes RME1 and RME2 are separated from each other between different pixels PX and between different subpixels PXn, light-emitting elements ED of each subpixel PXn may emit light independently.

A first electrode RME1 and a second electrode RME2 are illustrated as being disposed in the first subpixel PX1, but the disclosure is not limited thereto. The number and the location of electrodes (RME1 and RME2) disposed in each subpixel PXn may vary depending on the number of light-emitting elements ED disposed in each subpixel PXn.

The electrodes (RME1 and RME2) may be electrically connected to the light-emitting elements ED. The electrodes (RME1 and RME2) may be electrically connected to both end portions of each of the light-emitting elements ED via the contact electrodes (CNE1 and CNE2) that will be described below, and may transmit electrical signals applied thereto from voltage lines (VL1 and VL2), which are disposed in one of the second areas BA, to the light-emitting elements ED.

The electrodes (RME1 and RME2) may include a conductive material with high reflectance. For example, the electrodes (RME1 and RME2) may include, as a material with high reflectance, a metal such as silver (Ag), copper (Cu), or aluminum (Al) or an alloy containing Al, nickel (Ni), or lanthanum (La), but the disclosure is not limited thereto. The electrodes (RME1 and RME2) may further include a transparent conductive material. For example, the electrodes (RME1 and RME2) may include a material such as ITO, IZO, or indium tin zinc oxide (ITZO). In some embodiments, the electrodes (RME1 and RME2) may have a structure in which one or more layers formed of a transparent conductive material and one or more layers formed of a metal with high reflectance are stacked or may be formed as single layers including a transparent conductive material and a metal with high reflectance. For example, the electrodes (RME1 and RME2) may have a stack of ITO/Ag/ITO, ITO/Ag/IZO, or ITO/Ag/ITZO/IZO.

The electrodes (RME1 and RME2), which transmit electrical signals for aligning and driving the light-emitting elements ED, may be disposed in the first area AA, in which the via layer VIA is not disposed and which is surrounded by the via layer VIA. As the electrodes (RME1 and RME2) are disposed not to overlap the circuit elements in the second areas BA in a thickness direction, the light-emitting elements ED, which are disposed on the electrodes (RME1 and RME2), may also be disposed not to overlap the circuit elements. Accordingly, some of light emitted by the light-emitting elements ED may be output through the bottom surface of the first substrate SUB1 once it passes through the electrodes (RME1 and RME2). The first and second electrodes RME1 and RME2 may be formed to have a minimum width for aligning the light-emitting elements ED and thus to allow light emitted by the light-emitting elements ED to be properly output through the bottom surface of the first substrate SUB1.

The second interlayer insulating layer IL2 may be disposed on the second conductive layer. The second interlayer insulating layer IL2 may be disposed to overlap and protect the second conductive layer. The second interlayer insulating layer IL2 may be disposed in and across the first area AA, the second areas BA, and the third area CA.

The third conductive layer may be disposed on the second interlayer insulating layer IL2 in the second areas BA. The third conductive layer may include first source electrodes S1 and first drain electrodes D1 of the first transistors T1, the first conductive pattern CDP1, the second conductive pattern CDP2, and data lines DTL.

The first source electrodes S1 and the first drain electrodes D1 of the first transistors T1 may be disposed to partially overlap the first active layers ACT of the first transistors T1. The first source electrodes S1 and the first drain electrodes D1 may electrically contact the first active layers ACT through contact holes that penetrate the first gate insulating layer GI, the first interlayer insulating layer IL1, and the second interlayer insulating layer IL2. The first source electrodes S1 may electrically contact the lower metal layers BML through contact holes that penetrate the first gate insulating layer GI, the first interlayer insulating layer IL1, the second interlayer insulating layer IL2, and the buffer layer BL. The first drain electrodes D1 may be electrically connected to first voltage lines VL1 that will be described below, and the first source electrodes S1 may be electrically connected to the first conductive pattern CDP1, which is electrically connected to the first electrode RME1. The second conductive pattern CDP2 may be electrically connected to the second voltage lines VL2.

The first and second conductive patterns CDP1 and CDP2 may be electrically connected to the first and second electrodes RME1 and RME2, respectively. The first conductive pattern CDP1 may be electrically connected to the first electrode RME1 through the first electrode contact hole CTD, which penetrates the second interlayer insulating layer IL2, and the second conductive pattern CDP2 may be electrically connected to the second electrode RME2 through the second electrode contact hole CTS.

The data lines DTL may be electrically connected to other transistors than the first transistors T1 and may thus apply data signals to each subpixel PXn. A data line DTL is illustrated as being disposed in each of the second areas BA between a pair of adjacent first areas AA, but the disclosure is not limited thereto. In some embodiments, more than one data line DTL may be disposed between the pair of adjacent first areas AA and may be electrically connected to multiple subpixels PXn.

The via layer VIA may be disposed on the third conductive layer and the second interlayer insulating layer IL2. The via layer VIA may include a first via layer VIA1, which is disposed directly on the third conductive layer and the second interlayer insulating layer IL2, and a second via layer VIA2, which is disposed on the first via layer VIA1. A fourth conductive layer may be disposed between the first and second via layers VIA1 and VIA2. The first and second via layers VIA1 and VIA2 may function as insulating films between the third conductive layer and other layers disposed on the third conductive layer, in the second areas BA. The first and second via layers VIA1 and VIA2 may overlap and protect the third and fourth conductive layers.

The via layer VIA may overlap the second areas BA, in which circuit elements are disposed, may be arranged in a lattice pattern including portions extending in the first direction DR1 and portions extending in the second direction DR2 in a plan view, and may be disposed along the boundaries of the subpixels PXn to separate the neighboring subpixels PXn from each other. The via layer VIA may be disposed to surround the first area AA and the third area CA, which are disposed in each subpixel PXn, to separate the first area AA and the third area CA from each other. The portions of the via layer VIA that extend in the second direction DR2 may have a larger width between a pair of adjacent first areas AA than between a pair of adjacent third areas CA, and the distance between the pair of adjacent third areas CA may be smaller than the distance between the pair of adjacent first areas AA. However, the disclosure is not limited thereto. As another example, the width of the via layer VIA may be greater between the pair of adjacent third areas CA than between the pair of adjacent first areas AA.

The via layer VIA may be formed to have a predetermined height. The via layer VIA may prevent ink from spilling over to neighboring subpixels PXn during inkjet printing during the fabrication of the display device 10 and may separate ink, in which different groups of light-emitting elements ED are dispersed, such that the ink in different subpixels PXn is not mixed. The via layer VIA may include polyimide (PI), but the disclosure is not limited thereto.

In some embodiments, the via layer VIA may have inclined side surfaces, and a layer that may improve the emission efficiency of the light-emitting elements ED may be disposed on the inclined side surfaces of the via layer VIA. This will be described below.

The fourth conductive layer may be disposed on the first via layer VIA1. The fourth conductive layer may include the first voltage lines VL1 and the second voltage lines VL2. A high-potential voltage (or a first power supply voltage), which is to be provided to the first transistors T1, may be applied to the first voltage lines VL1, and a low-potential voltage (or a second power supply voltage), which is to be provided to the second electrode RME2, may be applied to the second voltage lines VL2.

The first voltage lines VL1 and the second voltage lines VL2 may extend in the second direction DR2 in the second areas BA. The first voltage lines VL1 and the second voltage lines VL2 may be formed not to overlap the electrodes (RME1 and RME2) and may be electrically connected to the electrodes (RME1 and RME2) via the conductive patterns (CDP1 and CDP2) of the third conductive layer. Although not specifically illustrated, the first voltage lines VL1 may be electrically connected to the first conductive pattern CDP1, which is disposed in the third conductive layer, and may be electrically connected to the first transistors T1 and the first electrode RME1. The second voltage lines VL2 may be electrically connected to the second conductive pattern CDP2, which is disposed in the third conductive layer, and may be electrically connected to the second electrode RME2. The conductive patterns (CDP1 and CDP2) may be electrically connected to the electrodes (RME1 and RME2) in the portions of the via layer VIA that extend in the first direction DR1, but the disclosure is not limited thereto. The first voltage lines VL1 and the second voltage lines VL2 may be arranged in a mesh structure including portions that extend in the first direction DR1, in a plan view. In this case, the second voltage lines VL2 may be directly connected to the second electrode RME2 without the aid of the second conductive pattern CDP2.

The first, second, third, and fourth conductive layers may be formed as a single layer or multi-layers including molybdenum (Mo), Al, chromium (Cr), gold (Au), titanium (Ti), Ni, neodymium (Nd), Cu, or an alloy thereof, but the disclosure is not limited thereto.

The buffer layer BL, the first gate insulating layer GI, the first interlayer insulating layer IL1, and the second interlayer insulating layer IL2 may be formed as a single layer or multi-layers, particularly, as inorganic multi-layers in which multiple inorganic films are stacked or alternately stacked. For example, the buffer layer BL, the first gate insulating layer GI, the first interlayer insulating layer IL1, and the second interlayer insulating layer IL2 may be formed as inorganic layers including at least one of silicon oxide ($SiO_x$), silicon nitride ($SiN_x$), and silicon oxynitride ($SiO_xN_y$), as multi-layers in which such inorganic layers are alternately stacked, or as double layers in which silicon oxide ($SiO_x$) and silicon nitride ($SiN_x$) are sequentially stacked.

In the first area AA1 surrounded by the via layer VIA, the light-emitting elements ED, the contact electrodes (CNE1 and CNE2), and insulating layers (PAS1 and PAS2) may be disposed. The light-emitting elements ED and the contact electrodes (CNE1 and CNE2) may be disposed directly on the second interlayer insulating layer IL2 in the first area AA1.

The light-emitting elements ED may be disposed to be spaced apart from one another in the direction in which the electrodes (RME1 and RME2) extend, for example, in a second direction DR2, and may be aligned substantially parallel to one another. The light-emitting elements ED may extend in a direction, and the direction in which the electrodes (RME1 and RME2) extend may form a substantially right angle with the direction in which the light-emitting elements ED extend. However, the disclosure is not limited thereto. As another example, the light-emitting elements ED may be arranged diagonally with respect to the direction in which the electrodes (RME1 and RME2) extend.

Each of the light-emitting elements ED may include semiconductor layers that are doped with dopants of different conductivity types. As each of the light-emitting elements ED includes semiconductor layers, the light-emitting elements ED may be aligned so that first end portions of each of the light-emitting elements ED may face a particular direction depending on the direction of an electric field formed on the electrodes (RME1 and RME2). Each of the light-emitting elements ED may include a light-emitting layer 36 (see FIG. 7) and may thus emit light of a particular wavelength range. Light-emitting layers 36 of different light-emitting elements ED may emit light of different wavelength ranges depending on the material(s) thereof, but the disclosure is not limited thereto. As another example, different light-emitting elements ED may emit light of the same color.

Layers may be arranged in each of the light-emitting elements ED, in a direction perpendicular to the top surface of the first substrate SUB1. The light-emitting elements ED of the display device 10 may be arranged such that a direction in which the light-emitting elements ED extend may be parallel to the first substrate SUB1, and the semiconductor layers included in each of the light-emitting elements ED may be sequentially arranged in a direction parallel to the top surface of the first substrate SUB1. However, the disclosure is not limited thereto. As another example, the layers included in each of the light-emitting elements ED may be arranged in a direction perpendicular to the first substrate SUB1.

The light-emitting elements ED may be disposed on the electrodes (RME1 and RME2), which are spaced apart from each other in the first direction DR1. The length of the light-emitting elements ED may be greater than the distance, in the first direction DR1, between the electrodes (RME1 and RME2), and both end portions of each of the light-emitting elements ED may be disposed on different electrodes (RME1 and RME2). First and second end portions of each of the light-emitting elements ED may be defined based on one of semiconductor layers included in the light-emitting elements ED. The first and second end portions of each of the light-emitting elements ED may be disposed on the electrodes (RME1 and RME2). The first and second portions of each of at least some of the light-emitting elements ED may be disposed on the first and second electrodes RME1 and RME2, respectively, but the disclosure is not limited thereto. As another example, the first and second end portions of each of at least some of the light-emitting elements ED may be disposed on the second and first electrodes RME2 and RME1, respectively. As another example, only an end portion of each of at least some of the light-emitting elements ED may be disposed on the electrodes (RME1 and RME2).

Both end portions of each of the light-emitting elements ED may electrically contact the contact electrodes (CNE1 and CNE2). As an insulating film 38 (see FIG. 7) may not be formed at both ends of each of the light-emitting elements ED to expose portions of the semiconductor layers of each of the light-emitting elements ED, the exposed semiconductor layers may electrically contact the contact electrodes (CNE1 and CNE2), but the disclosure is not limited thereto. As another example, at least a portion of the insulating film 38 may be removed so that portions of side surfaces of the semiconductor layers of each of the light-emitting elements ED may be exposed. The exposed side surfaces of the semiconductor layers may directly contact the contact electrodes (CNE1 and CNE2). The light-emitting elements ED may be electrically connected to the electrodes (RME1 and RME2) via the contact electrodes (CNE1 and CNE2).

A first insulating layer PAS1 may be disposed on portions of the light-emitting elements ED. For example, the first insulating layer PAS1 may be disposed to surround portions of the outer surfaces of the light-emitting elements ED, but not to cover or overlap the first and second end portions of each of the light-emitting elements ED. As the first insulating layer PAS1 is disposed on the light-emitting elements ED to extend in the second direction DR2 in a plan view, the first insulating layer PAS1 may form a linear or island pattern in each subpixel PXn. The shape of first insulating layer PAS1 may be initially disposed on the entire surface of the second interlayer insulating layer IL2, in the first area AA, during the fabrication of the display device 10 and may then be partially removed to expose both end portions of each of the light-emitting elements ED. The first insulating layer PAS1 may protect and fix the light-emitting elements ED during the fabrication of the display device 10.

Although not specifically illustrated, a portion of the first insulating layer PAS1 may be disposed in the third area CA. The electrodes RME1 and RME2 disposed in the subpixels PXn may extend in the second direction DR2 and be connected to each other and may then each be separated into two portions in the third area CA after the alignment of the light-emitting elements ED and the formation of the first insulating layer PAS1. During the separation of the electrodes (RME1 and RME2), not only the electrodes (RME1 and RME2), but also the first insulating layer PAS1 and the second interlayer insulating layer IL2 may be partially removed from the third area CA.

The contact electrodes (CNE1 and CNE2) and a second insulating layer PAS2 may be disposed on the first insulating layer PAS1. The contact electrodes (CNE1 and CNE2) may electrically contact an end portion of each of the light-emitting elements ED and at least one of the electrodes (RME1 and RME2). For example, the contact electrodes (CNE1 and CNE2) may electrically contact an end portion of each of the light-emitting elements ED, exposed by the first insulating layer PAS1, and may contact at least one of the electrodes (RME1 and RME2) through the contact holes (CT1 and CT2), which are formed in the second interlayer insulating layer IL2 to expose portions of the electrodes (RME1 and RME2). Both end portions of each of the light-emitting elements ED may be electrically connected to the electrodes (RME1 and RME2) via different contact electrodes (CNE1 and CNE2).

The contact electrodes (CNE1 and CNE2) may include a first contact electrode CNE1, which electrically contacts the first end portions of the light-emitting elements ED and the first electrode RME1, and a second contact electrode CNE2, which electrically contacts the second end portions of the light-emitting elements ED and the second electrode RME2. The first and second contact electrodes CNE1 and CNE2 may be disposed on portions of the first and second electrodes RME1 and RME2, respectively. The first contact electrode CNE1 may electrically contact the first electrode RME1 through first contact holes CT1, which expose the top surface of the first electrode RME1, and a second contact electrode CNE2 may electrically contact the second electrode RME2 through second contact holes CT2, which expose the top surface of the second electrode RME2. The first and second contact electrodes CNE1 and CNE2 may extend in the second direction DR2 and may form linear patterns in the first area AA of each subpixel PXn.

For example, the width, in the first direction DR1, of the contact electrodes (CNE1 and CNE2) may be greater than the width, in the first direction DR1, of the electrodes (RME1 and RME2). Some of light emitted by the light-emitting elements ED may be output toward the first substrate SUB1 below the light-emitting elements ED. The first and second electrodes RME1 and RME2 may be disposed to occupy a minimum area and to allow some of the light emitted by the light-emitting elements ED to be properly output toward the bottom surface of the first substrate SUB1. If the electrodes (RME1 and RME2) are too wide, the light emitted by the light-emitting elements ED may be reflected by the electrodes (RME1 and RME2) and may thus travel upward, and as a result, the bottom luminance of the display device 10 may be undesirably low. In an embodiment, the electrodes (RME1 and RME2) are formed to be narrower than the contact electrodes (CNE1 and CNE2), and the display device 10 can have a sufficiently high luminance at the bottom thereof.

The contact holes (CT1 and CT2), which are formed in areas where the contact electrodes (CNE1 and CNE2) electrically contact the electrodes (RME1 and RME2), may be disposed not to overlap the light-emitting elements ED in the first direction DR1, in the first area AA. For example, the contact holes (CT1 and CT2) may be spaced apart from the region in which the light-emitting elements ED are disposed, in the second direction DR2, to be disposed adjacent to the portions of the via layer VIA that extend in the first direction DR1. The light-emitting elements ED may emit light through both end portions thereof, and the contact holes (CT1 and CT2) may be disposed to avoid the path of light emitted by the light-emitting elements ED, but the disclosure is not limited thereto. The locations of the contact holes (CT1 and CT2) may vary depending on the structures of the electrodes (RME1 and RME2) and the locations of the light-emitting elements ED.

A first contact electrode CNE1 and a second contact electrode CNE2 are illustrated as being disposed in a subpixel PXn, but the disclosure is not limited thereto. The number and shape of contact electrodes (CNE1 and CNE2) may vary depending on the number of electrodes (RME1 and RME2) disposed in each subpixel PXn.

The contact electrodes (CNE1 and CNE2) may include a conductive material. For example, the contact electrodes (CNE1 and CNE2) may include ITO, IZO, ITZO, or aluminum (Al). For example, the contact electrodes (CNE1 and CNE2) may include a transparent conductive material, and light emitted from the light-emitting elements ED may pass through the contact electrodes (CNE1 and CNE2).

Portions of first and second contact electrodes CNE1 and CNE2 may be disposed in different layers. The first contact electrode CNE1 may be disposed directly on the first insulating layer PAS1, and the second contact electrode CNE2 may be disposed on the second insulating layer PAS2, which overlaps the first contact electrode CNE1. The second insulating layer PAS2 may insulate the first and second contact electrodes CNE1 and CNE2 from each other such that the first and second contact electrodes CNE1 and CNE2 may not directly contact each other.

The second insulating layer PAS2 may be disposed between the first and second contact electrodes CNE1 and CNE2 to electrically insulate the first and second contact electrodes CNE1 and CNE2 from each other. As another example, the second insulating layer PAS2 may not be provided, in which case, the first and second contact electrodes CNE1 and CNE2 may be disposed in the same layer. Even if the second insulating layer PAS2 is provided, the first and second contact electrodes CNE1 and CNE2 may be disposed directly on the second interlayer insulating layer IL2 in regions in which the first and second contact electrodes CNE1 and CNE2 electrically contact the light-emitting elements ED.

Although not specifically illustrated, an insulating layer may be further disposed on the contact electrodes (CNE1 and CNE2), the second insulating layer PAS2, and the via layer VIA to cover or overlap the contact electrodes (CNE1 and CNE2), the second insulating layer PAS2, and the via layer VIA. The insulating layer may be disposed on the entire surface of the first substrate SUB1 to protect the elements disposed on the first substrate SUB1 from an external environment.

The first and second insulating layers PAS1 and PAS2 may include an inorganic insulating material or an organic insulating material. For example, the first and second insulating layers PAS1 and PAS2 may include an inorganic insulating material such as silicon oxide ($SiO_x$), silicon nitride ($SiN_x$), silicon oxynitride ($SiO_xN_y$), aluminum oxide ($AlO_x$), or aluminum nitride ($AlN_x$), but the disclosure is not limited thereto. In another example, the first and second insulating layers PAS1 and PAS2 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin, but the disclosure is not limited thereto.

As described above, the display device 10 may include, in each subpixel PXn, the first area AA, in which the light-emitting elements ED are disposed, and the second areas BA, in which the circuit elements for driving the light-emitting elements ED are disposed. The first area AA and the second areas BA may be separated from each other by the via layer VIA, and as the light-emitting elements ED are disposed only in the first area AA surrounded by the via layer VIA, the light-emitting elements ED may be disposed not to overlap the circuit elements. Light emitted by the light-emitting elements ED may be output not only through the top of the first substrate SUB1, but also through the bottom of the first substrate SUB1.

Figure 6:
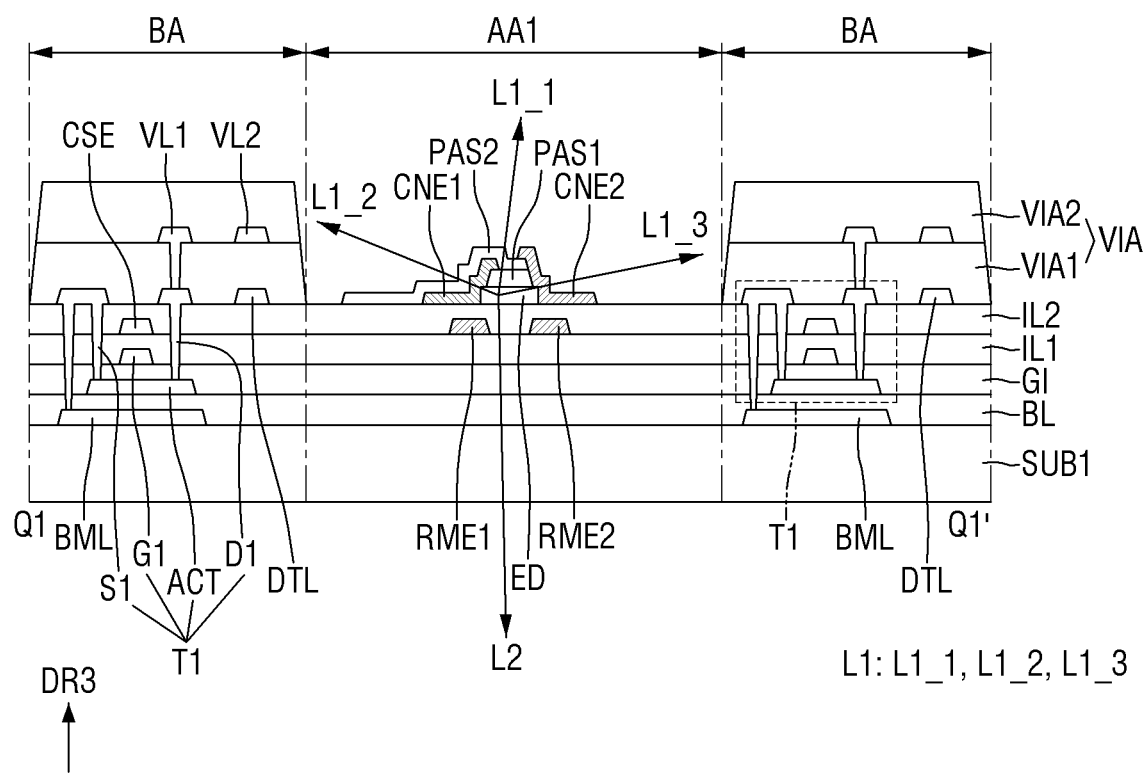
FIG. 6 is a schematic cross-sectional view illustrating how light is emitted from light-emitting elements of the display device 1.

FIG. 6 is a schematic cross-sectional view illustrating how light is emitted from the light-emitting elements of the display device 10.

Referring to FIG. 6, light emitted from the light-emitting elements ED of the first subpixel PX1 may include first light L1, which is emitted upward from the second interlayer insulating layer IL2, and second light L2, which is emitted downward from the second interlayer insulating layer IL2. As will be described below, each of the light-emitting elements ED may include a light-emitting layer 36 (see FIG. 7), and the light-emitting layer 36 may generate light by receiving electrical signals applied thereto from the electrodes (RME1 and RME2). Some of the light generated by the light-emitting layer 36 may travel in random directions. For example, some of the light generated by the light-emitting layer 36 may be output in an upward direction from the second interlayer insulating layer IL2, and some of the light generated by the light-emitting layer 36 may be output in a downward direction from the second interlayer insulating layer IL2.

For example, among the light emitted by the light-emitting elements ED, the first light L1 may be emitted upward from the second interlayer insulating layer IL2 through the side surface or both end surfaces of each of the light-emitting elements ED. Among beams of the first light L1, first sub-light L1_1 may be emitted from the side surfaces of the light-emitting element ED and may pass through the first and second insulating layers PAS1 and PAS2. The first sub-light L1_1 may be emitted in an upward direction from the first substrate SUB1 and may be output through the front surface of the display device 10. Among the beams of the first light L1, second sub-light L1_2 and third sub-light L1_3 may be emitted from both end surfaces of each of the light-emitting elements ED and may pass through the contact electrodes (CNE1 and CNE2), which are formed of a transparent material, and through the second insulating layer PAS2. The second sub-light L1_2 and the third sub-light L1_3 may travel toward the inclined side surfaces of the via layer VIA along the path of the light emitted by the light-emitting elements ED. However, similar to the first sub-light L1_1, some of the second sub-light L1_2 and some of the third sub-light L1_3 may travel in the upward direction from the first substrate SUB1 and may then be output through the front surface of the display device 10.

Some of the light emitted by the light-emitting elements ED may be the second light L2, which is emitted downward from the second interlayer insulating layer IL2. The light-emitting elements ED may be disposed only in the first area AA1 in which circuit elements are not disposed, and only the electrodes (RME1 and RME2), which are electrically connected to the light-emitting elements ED, may be disposed below the light-emitting elements ED. As described above, the electrodes (RME1 and RME2) may have a minimum width as long as they may properly align the light-emitting elements ED, and most of the second light L2 emitted by the light-emitting elements ED may travel toward regions in which the electrodes (RME1 and RME2) are not disposed. The second light L2 may pass through the layers below the light-emitting elements ED and may then be output through the bottom surface of the first substrate SUB1.

The electrodes (RME1 and RME2), which are in the first area AA1, and the capacitive electrodes CSE, which are in the second areas BA, may be disposed in the same layer (for example, on the second conductive layer). Even if the electrodes (RME1 and RME2) and circuit elements are disposed in different areas defined by the via layer VIA, the electrodes (RME1 and RME2) and the circuit elements may be formed by the same process during the fabrication of the display device 10. Accordingly, even if the light-emitting elements ED and the contact electrodes (CNE1 and CNE2) are formed in the first area AA1 after the formation of the via layer VIA and the circuit elements in the second areas BA, an additional process for forming the electrodes (RME1 and RME2) is not needed, which is highly advantageous in terms of efficiency.

The light-emitting elements ED may be disposed only in the first area AA, in which no circuit elements are disposed, and a double-sided light-emitting display device capable of emitting light through both the top surface and the bottom surface of the first substrate SUB1 can be implemented.

Figure 7:
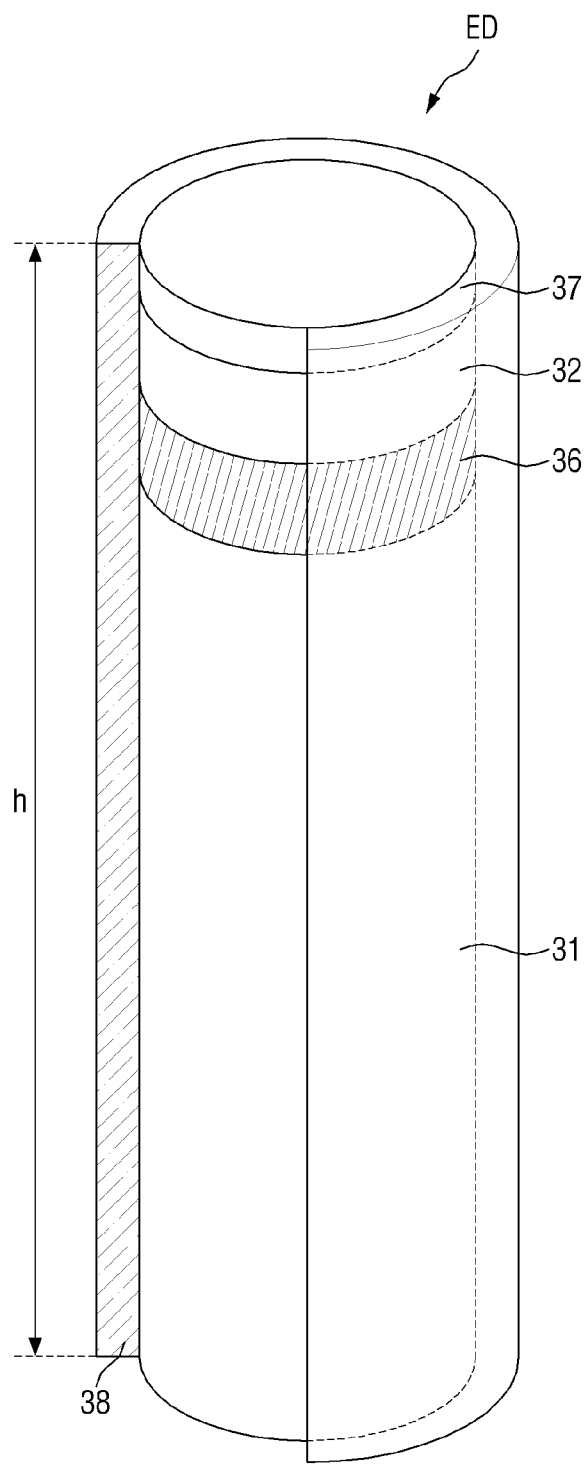
FIG. 7 is a schematic perspective view of a light-emitting element according to an embodiment of the disclosure.

FIG. 7 is a schematic perspective view of a light-emitting element according to an embodiment.

Referring to FIG. 7, a light-emitting element ED may be a light-emitting diode (LED), particularly, an ILED having a size in a range of micrometers to nanometers and formed of an inorganic material. If an electric field is formed in a particular direction between two opposite electrodes, the ILED may be aligned between the two electrodes where polarities thereof are formed. The light-emitting element ED may be aligned by the electric field formed between the two electrodes.

The light-emitting element ED may have a shape that extends in a direction. The light-emitting element ED may have a shape of a cylinder, a rod, a wire, or a tube, but the shape of the light-emitting element ED is not particularly limited. As another example, the light-emitting element ED may have the shape of a polygonal column such as a regular cube, a rectangular parallelepiped, or a hexagonal column or may have a shape that extends in a direction and has a partially inclined outer surface. Semiconductors included in the light-emitting element ED may be sequentially disposed or stacked in the direction in which the light-emitting element ED extends.

The light-emitting element ED may include semiconductor layers doped with impurities of a conductivity type (e.g., a p-type or an n-type). The semiconductor layers may receive electrical signals from an external power source and may emit light of a particular wavelength range.

The light-emitting element ED may include a first semiconductor layer 31, a second semiconductor layer 32, the light-emitting layer 36, an electrode layer 37, and the insulating film 38.

The first semiconductor layer 31 may include an n-type semiconductor. In case that the light-emitting element ED emits light of a blue wavelength range, the first semiconductor layer 31 may include a semiconductor material having Formula: $Al_xGa_yIn_{1-x-y}N$ (where $0 \leq x \leq 1$, $0 \leq y \leq 1$, and $0 \leq x+y \leq 1$). The semiconductor material $Al_xGa_yIn_{1-x-y}N$ may be at least one of AlGaInN, GaN, AlGaN, InGaN, AlN, and InN that are doped with an n-type dopant. The first semiconductor layer 31 may be doped with an n-type dopant, and the n-type dopant may be Si, Ge, or Sn. For example, the first semiconductor layer 31 may be n-GaN doped with n-type Si. The first semiconductor layer 31 may have a length of about 1.5 μm to about 5 μm, but the disclosure is not limited thereto. A first end portion of the light-emitting element ED may be portion of the light-emitting element ED where the first semiconductor layer 31 is disposed with respect to the light-emitting layer 36.

The second semiconductor layer 32 may be disposed on the light-emitting layer 36 described below. The second semiconductor layer 32 may include a p-type semiconductor. In a case where the light-emitting element ED emits light of a blue or green wavelength range, the second semiconductor layer 32 may include a semiconductor material $Al_xGa_yIn_{1-x-y}N$ (where $0 \leq x \leq 1$, $0 \leq y \leq 1$, and $0 \leq x+y \leq 1$). For example, the semiconductor material $Al_xGa_yIn_{1-x-y}N$ may be at least one of AlGaInN, GaN, AlGaN, InGaN, AlN, and InN that are doped with a p-type dopant. The second semiconductor layer 32 may be doped with a p-type dopant, and the p-type dopant may be Mg, Zn, Ca, Se, or Ba. For example, the second semiconductor layer 32 may be p-GaN doped with p-type Mg. The second semiconductor layer 32 may have a length of about 0.05 μm to about 0.10 μm, but the disclosure is not limited thereto. A second end portion of the light-emitting element ED may be portion of the light-emitting element ED where the second semiconductor layer 32 is disposed with respect to the light-emitting layer 36.

FIG. 7 illustrates that the first and second semiconductor layers 31 and 32 may be formed as single layers, but the disclosure is not limited thereto. As another example, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 may be disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by the combining of electron-hole pairs in response to electrical signals applied thereto via the first and second semiconductor layers 31 and 32. In a case where the light-emitting layer 36 emits light of a blue wavelength range, the quantum layers may include a material such as AlGaN or AlGaInN. In particular, in a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN. For example, in a case where the light-emitting layer 36 includes AlGaInN as its quantum layer(s) and AlInN as its well layer(s), the light-emitting layer 36 can emit blue light having a central wavelength range of about 450 nm to about 495 nm.

However, the disclosure is not limited thereto. As another example, the light-emitting layer 36 may have a structure in which a semiconductor material having a large band gap energy and a semiconductor material having a small band gap energy are alternately stacked or may include group III to group V semiconductor materials depending on the wavelength of light to be emitted. The type of light emitted by the light-emitting layer 36 is not particularly limited. The light-emitting layer 36 may emit light of a red or green wavelength range as desired. The light-emitting layer 36 may have a length of about 0.05 μm to about 0.10 μm, but the disclosure is not limited thereto.

Light emitted by the light-emitting layer 36 may be emitted not only from the circumferential surface, in a length direction, of the light-emitting element ED, but also from both side surfaces of the light-emitting element ED. The directionality of the light emitted from the light-emitting layer 36 is not particularly limited.

The electrode layer 37 may be an ohmic contact electrode, but the disclosure is not limited thereto. As another example, the electrode layer 37 may be a Schottky contact electrode. The light-emitting element ED may include at least one electrode layer 37. FIG. 7 illustrates that the light-emitting element ED includes an electrode layer 37, but the disclosure is not limited thereto. As another example, the light-emitting element ED may include more than one electrode layer 37, or the electrode layer 37 may not be provided. However, the following description of the light-emitting element ED may also be applicable to a light-emitting element ED including more than one electrode layer 37 or having a different structure from the light-emitting element ED of FIG. 7.

The electrode layer 37 may reduce the resistance between the light-emitting element ED and electrodes (or contact electrodes) in case that the light-emitting element ED is electrically connected to the electrodes (or the contact electrodes). The electrode layer 37 may include a conductive metal. For example, the electrode layer 37 may include at least one of Al, Ti, In, gold (Au), Ag, ITO, IZO, and ITZO. The electrode layer 37 may include a semiconductor material doped with an n- or p-type dopant. However, the disclosure is not limited thereto.

The insulating film 38 may be disposed to surround the first and second semiconductor layers 31 and 32 and the electrode layer 37. For example, the insulating film 38 may be disposed to surround at least the light-emitting layer 36 and may extend in the direction in which the light-emitting element ED extends. The insulating film 38 may protect the first semiconductor layer 31, the light-emitting layer 36, the second semiconductor layer 32, and the electrode layer 37. For example, the insulating film 38 may be formed to surround the sides of the first semiconductor layer 31, the light-emitting layer 36, the second semiconductor layer 32, and the electrode layer 37, but may expose both end portions, in the length direction, of the light-emitting element ED.

FIG. 7 illustrates that the insulating film 38 extends in the length direction of the light-emitting element ED and covers the sides of the first semiconductor layer 31, the light-emitting layer 36, the second semiconductor layer 32, and the electrode layer 37, but the disclosure is not limited thereto. The insulating film 38 may cover the sides of only the light-emitting layer 36 and portions of the first and second semiconductor layers 31 and 32 or may cover only a portion of the side of the electrode layer 37 so that the side of the electrode layer 37 may be partially exposed. The insulating film 38 may be formed to be rounded in a cross-sectional view, in a region adjacent to at least one end of the light-emitting element ED.

The insulating film 38 may have a thickness of about 10 nm to about 1.0 μm, but the disclosure is not limited thereto. The insulating film 38 may have a thickness of about 40 nm.

The insulating film 38 may include a material with insulating properties such as, for example, silicon oxide ($SiO_x$), silicon nitride ($SiN_x$), silicon oxynitride ($SiO_xN_y$), aluminum nitride ($AlN_x$), or aluminum oxide ($AlO_x$). The insulating film 38 is illustrated as being a single-layer film, but the disclosure is not limited thereto. As another example, in some embodiments, the insulating film 38 may be formed as a multilayer film in which multiple layers are stacked. The insulating film 38 can prevent a short circuit that may occur in case that the light-emitting layer 36 directly contacts electrodes that transmit electrical signals directly to the light-emitting element ED. Since the insulating film 38 includes the light-emitting layer 36 to protect the outer surface of the light-emitting element ED, a reduction in the emission efficiency of the light-emitting element ED can be prevented.

The outer surface of the insulating film 38 may be surface-treated. The light-emitting element ED may be sprayed on electrodes while being scattered or dispersed in a predetermined ink. Here, the surface of the insulating film 38 may be hydrophobically or hydrophilically treated to keep the light-emitting element ED scattered in ink without agglomerating with other neighboring light-emitting elements ED. For example, the insulating film 38 may be surface-treated with a material such as stearic acid or 2,3-naphthalene dicarboxylic acid.

A height h of the light-emitting element ED may be about 1 μm to about 10 μm, about 2 μm to about 6 μm, or about 3 μm to about 5 μm, but the disclosure is not limited thereto. The light-emitting element ED may have a diameter of about 30 nm to about 700 nm and an aspect ratio of about 1.2 to about 100, but the disclosure is not limited thereto. As another example, different light-emitting elements ED may have different diameters depending on the difference between the compositions of their respective light-emitting layers 36. The light-emitting element ED may have a diameter of about 500 nm.

The fabrication of the display device 10 will hereinafter be described.

FIGS. 8 to 15 are schematic cross-sectional views illustrating a method of fabricating a display device according to an embodiment. The order and method by which layers of the display device 10 are formed will hereinafter be described, but since the structures and arrangement of the layers of the display device 10 are as already described above, descriptions thereof will be omitted. FIGS. 8 to 15 illustrate processes of the fabrication of the display device 10, performed in the first area AA1 and the second areas BA of the first subpixel PX1, in cross-sectional views.

Figure 8:
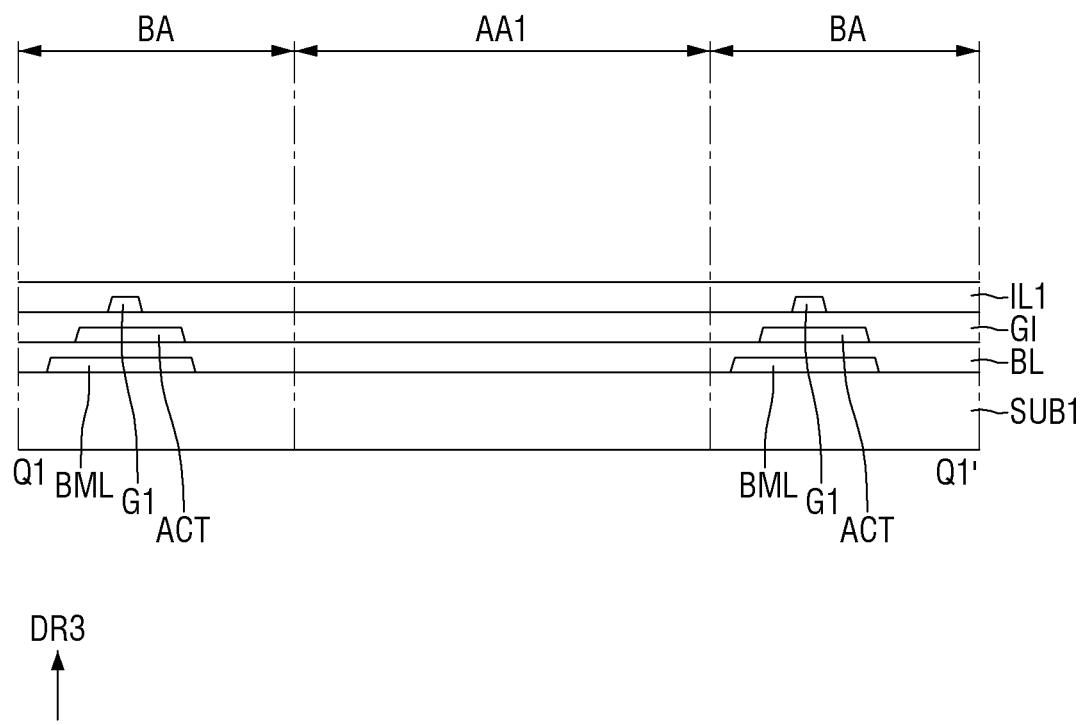
FIGS. 8 through 15 are schematic cross-sectional views illustrating a method of fabricating a display device according to an embodiment of the disclosure.

Referring first to FIG. 8, the first substrate SUB1 may be prepared, and the lower metal layers BML, the buffer layer BL, the first active layers ACT, the first gate insulating layer GI, the first conductive layer, and the first interlayer insulating layer IL1 may be sequentially formed on the first substrate SUB1. The first conductive layer may include the first gate electrodes G1, which are disposed to overlap the first active layers ACT. The lower metal layers BML, the first active layers ACT, and the first conductive layer may be formed by forming layers formed of corresponding materials and patterning the layers into particular shapes. The buffer layer BL, the first gate insulating layer GI, and the first interlayer insulating layer IL1 may be formed by depositing layers formed of corresponding materials on the first substrate SUB1. The lower metal layers BML, the first active layers ACT, and the first conductive layer may be formed only in the second areas BA, in which the via layer VIA is formed.

Figure 9:
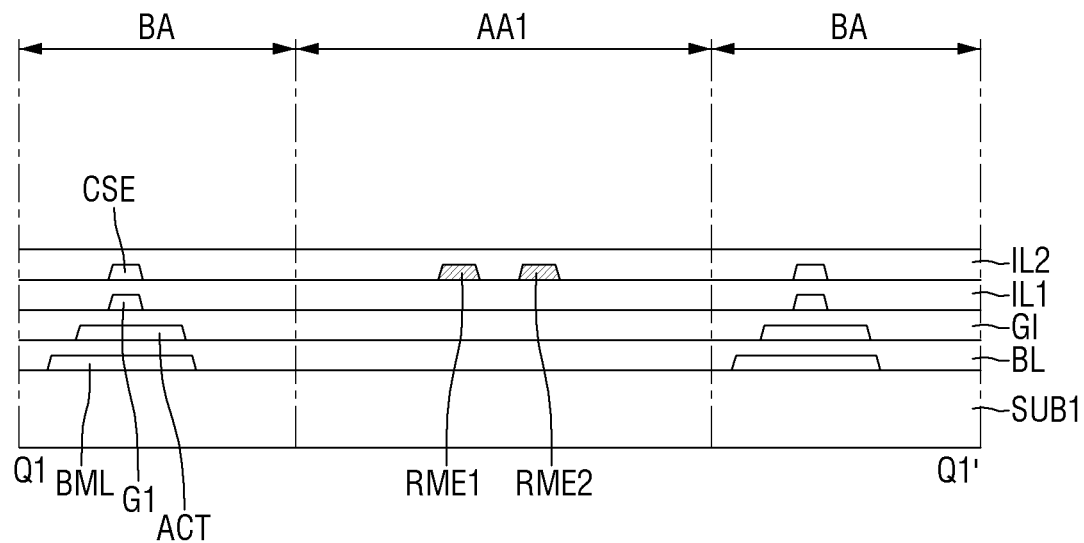

Thereafter, referring to FIG. 9, the second conductive layer and the second interlayer insulating layer IL2 may be formed on the first interlayer insulating layer IL1. The second conductive layer may include the capacitive electrodes CSE, which are disposed in the second areas BA, and the electrodes (RME1 and RME2), which are formed in the first area AA1. The capacitive electrodes CSE may be disposed in the second areas BA to form circuit elements, and the electrodes (RME1 and RME2) may be disposed in the first area AA1 and may be used below to align the light-emitting elements ED.

Figure 10:
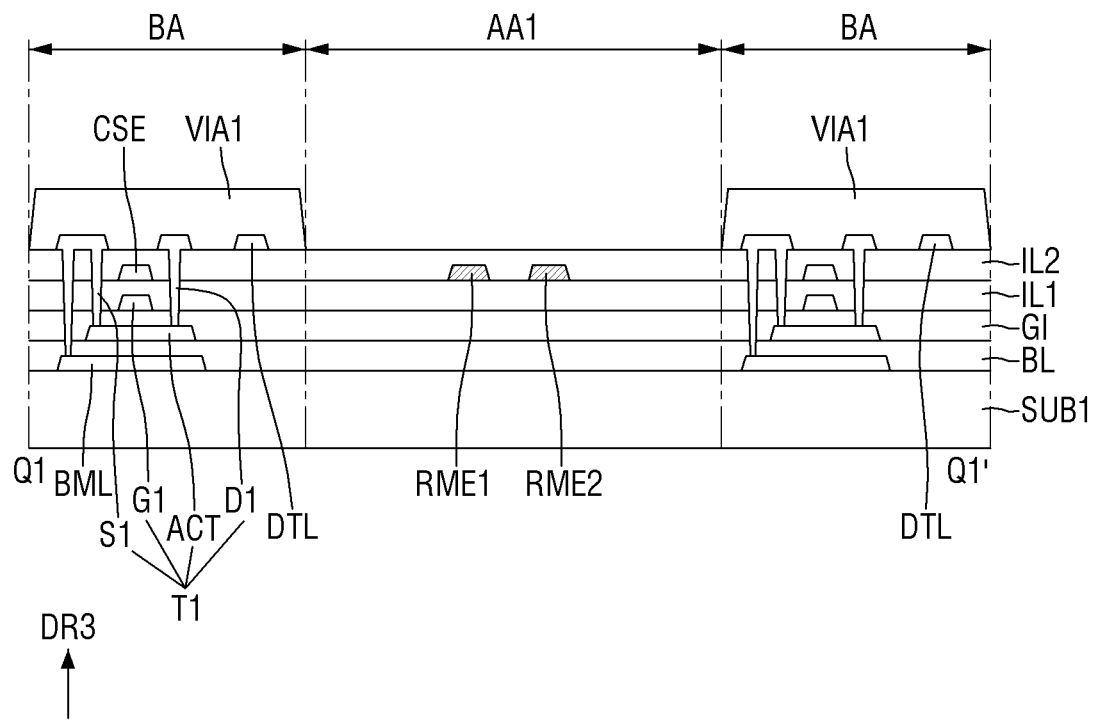
Figure 11:
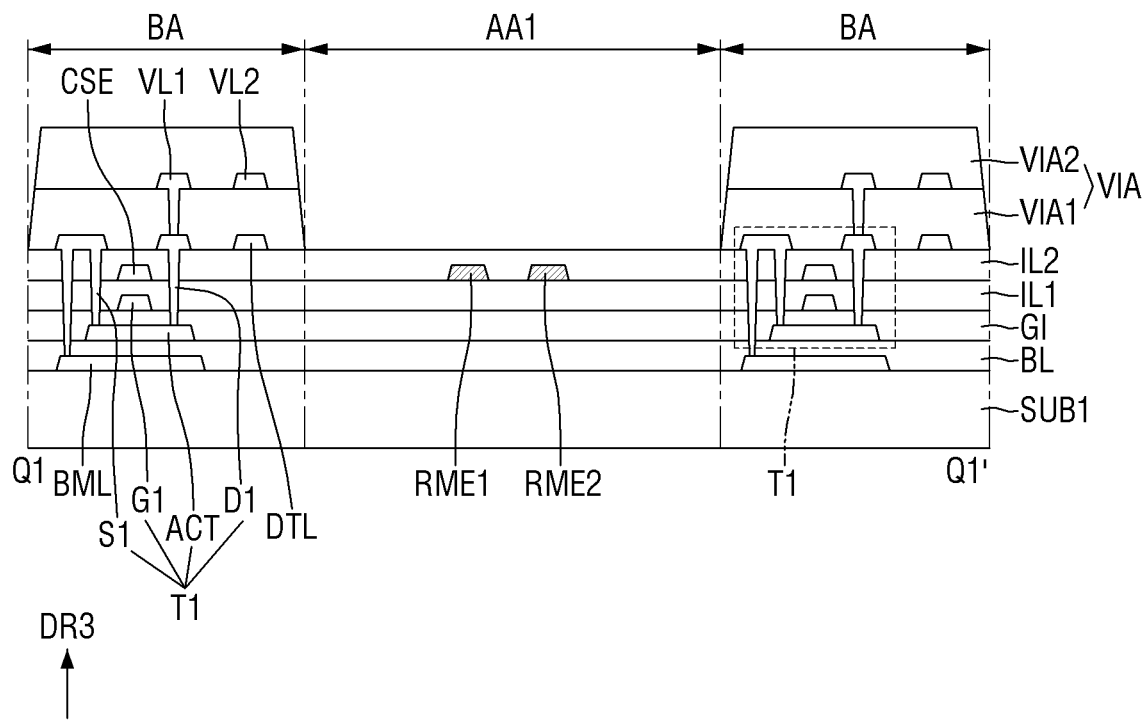

Thereafter, referring to FIGS. 10 and 11, the third conductive layer, the fourth conductive layer, and the via layer VIA may be formed on the second interlayer insulating layer IL2, in the second areas BA. The third conductive layer may include the first source electrodes S1 and the first drain electrodes D1 of the first transistors T1 and the conductive patterns (CDP1 and CDP2). The fourth conductive layer may include the first voltage lines VL1 and the second voltage lines VL2. The via layer VIA may include the first via layer VIA1, which is disposed directly on the second interlayer insulating layer IL2, and the second via layer VIA2, which is disposed on the first via layer VIA1. The fourth conductive layer may be disposed between the first and second via layers VIA1 and VIA2. The via layer VIA may be formed by forming a layer formed of a corresponding material on the entire surface of the second interlayer insulating layer IL2 and patterning the layer to expose a portion of the second interlayer insulating layer IL2 in the first area AA1. In this manner, circuit elements may be formed in the second areas BA.

Figure 12:
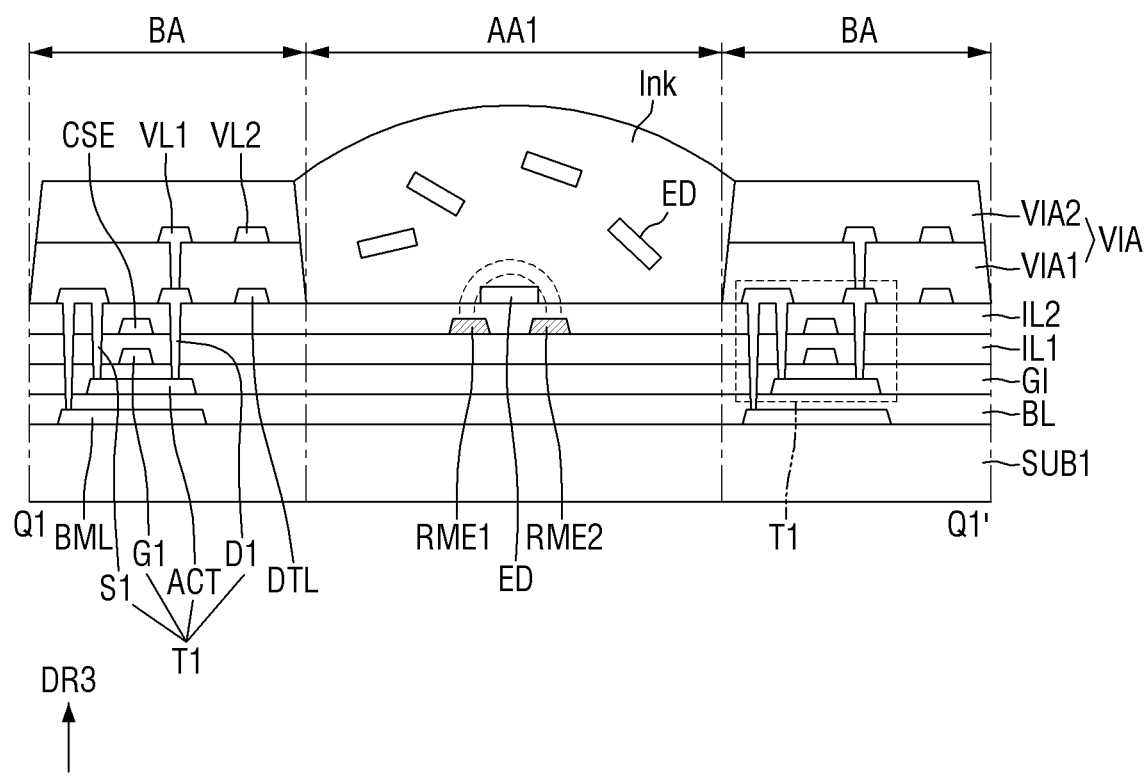
Figure 13:
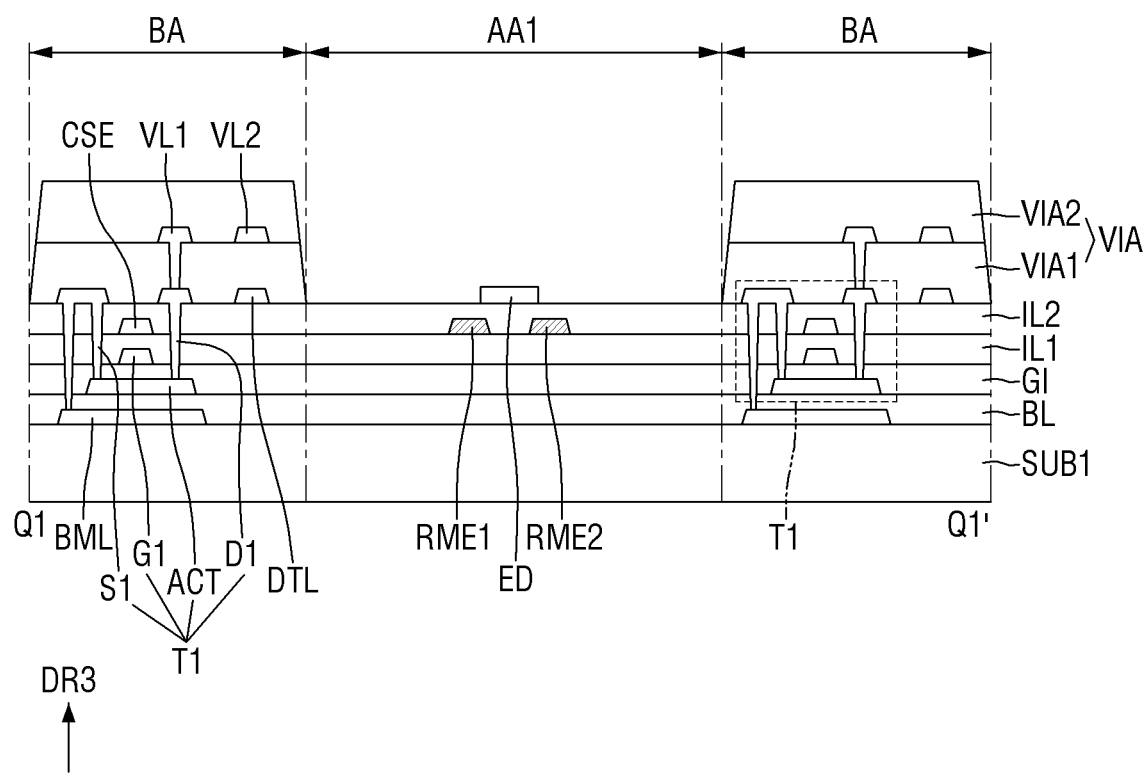

Thereafter, referring to FIGS. 12 and 13, the light-emitting elements ED may be disposed on the second interlayer insulating layer IL2, in the first area AA1. For example, the light-emitting elements ED may be provided in a state of being dispersed in ink and may be sprayed onto the first area AA1 of the first subpixel PX1 by inkjet printing. The via layer VIA may prevent the ink from spilling over to the first areas AA of other neighboring subpixels PXn. Once the ink is sprayed onto the first area AA1, an electric field may be formed in the first area AA1 by applying alignment signals to the electrodes (RME1 and RME2). As the light-emitting elements ED dispersed in the ink receive a dielectrophoretic force from the electric field, the location and the alignment direction of the light-emitting elements ED may change, and as a result, the light-emitting elements ED may be arranged such that both end portions thereof may be placed on different electrodes (RME1 and RME2).

Figure 14:
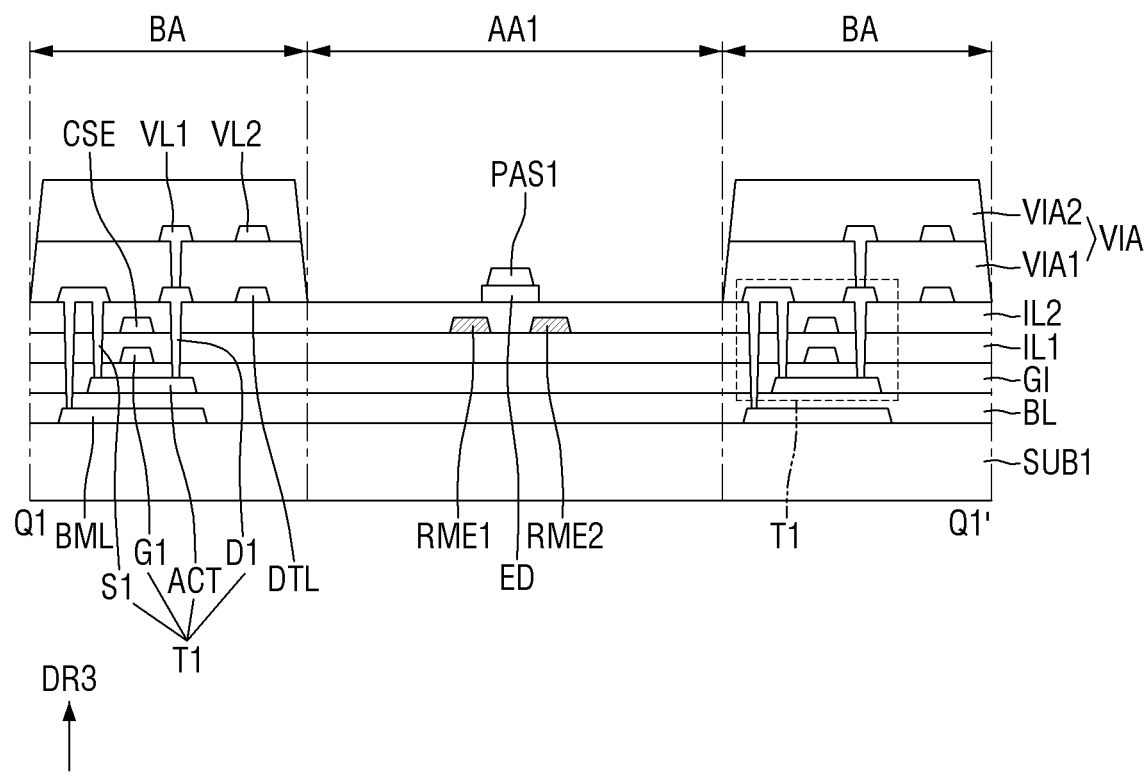
Figure 15:
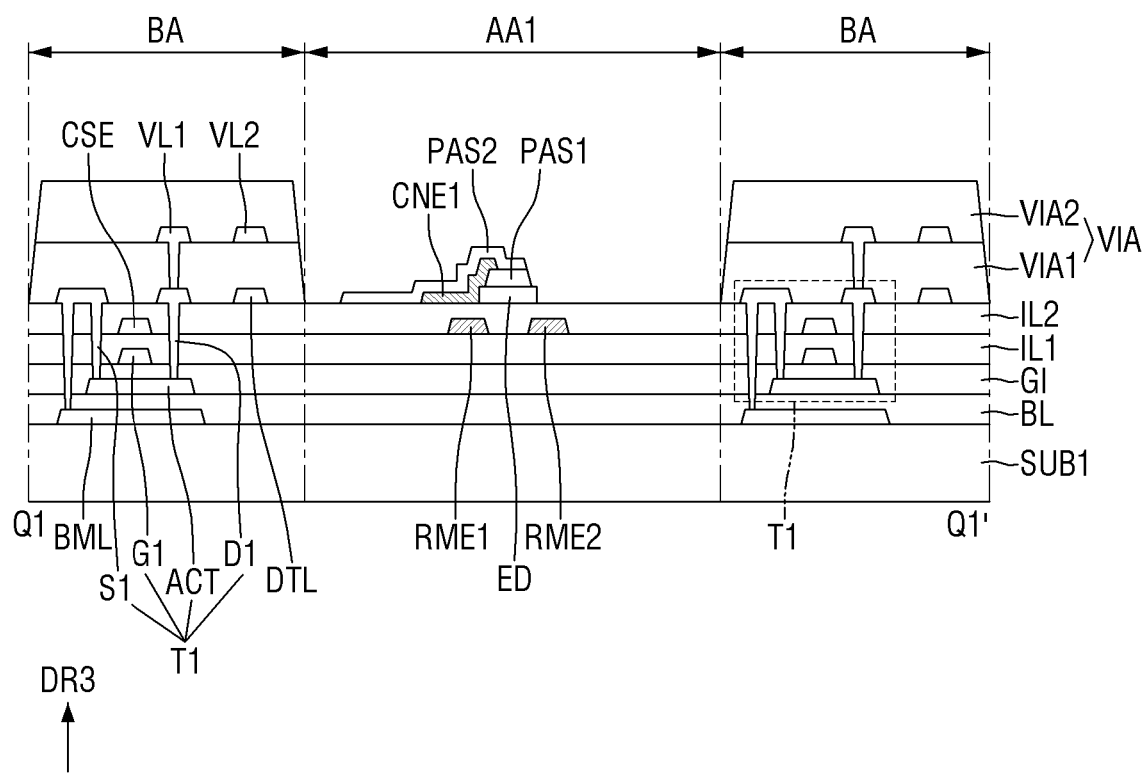

Thereafter, referring to FIGS. 14 and 15, the first insulating layer PAS1, the first contact electrode CNE1, and the second insulating layer PAS2 may be formed on the light-emitting elements ED. The first contact electrode CNE1, the first insulating layer PAS1, and the second insulating layer PAS2 may be formed by forming layers of corresponding materials on the entire surface of the portion of the second interlayer insulating layer IL2 in the first area AA1 and patterning the layers. The first insulating layer PAS1 may be formed first to affix the light-emitting elements ED, and the first contact electrode CNE1 may be formed by patterning the first insulating layer PAS1. Thereafter, the second insulating layer PAS2 may be formed on the first contact electrode CNE1.

Thereafter, although not specifically illustrated, the second contact electrode CNE2 may be formed on the second insulating layer PAS2, thereby obtaining the display device 10.

Display devices according to other embodiments will hereinafter be described.

Figure 16:
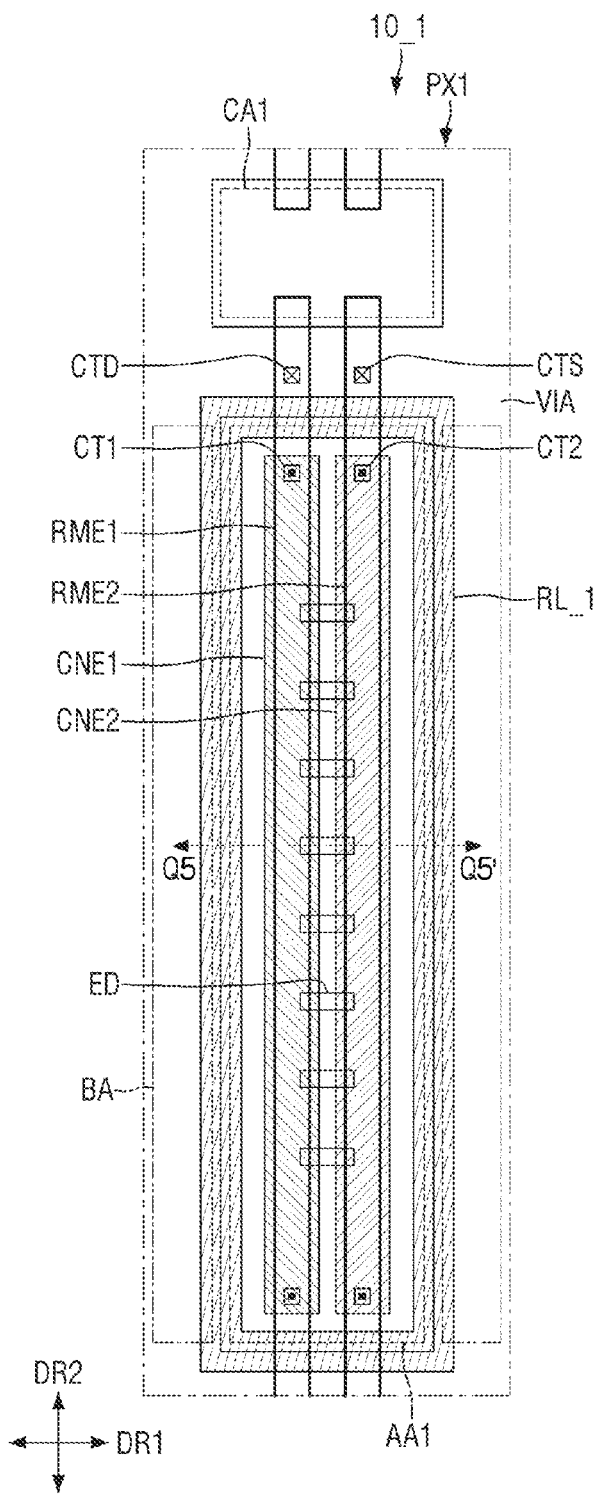
FIG. 16 is a schematic plan view of a subpixel of a display device according to another embodiment of the disclosure.
Figure 17:
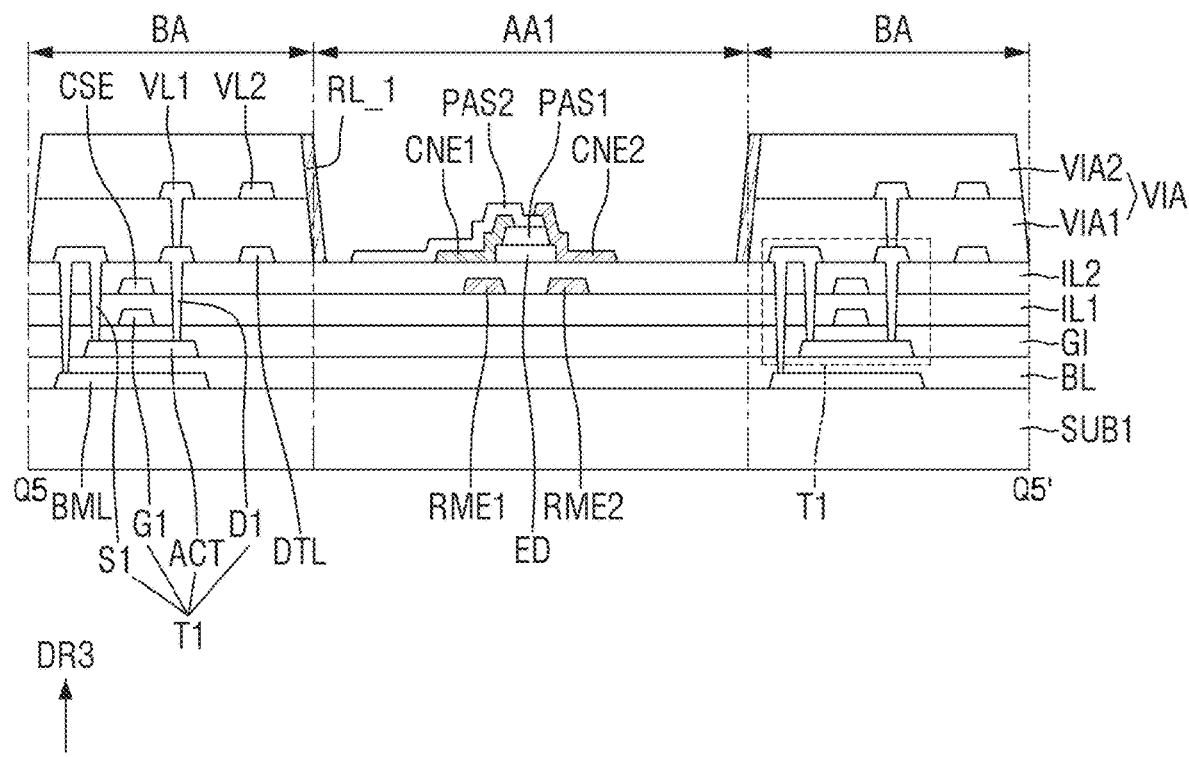
FIG. 17 is a schematic cross-sectional view taken along line Q5-Q5' of FIG. 16.

FIG. 16 is a schematic plan view of a subpixel of a display device according to another embodiment. FIG. 17 is a schematic cross-sectional view taken along line Q5-Q5' of FIG. 16.

Referring to FIGS. 16 and 17, a display device 10_1 may further include, in each subpixel PXn, for example, in a first subpixel PX1, a reflective layer RL_1, which surrounds a first area AA1 and is disposed on inclined side surfaces of a via layer VIA. The display device 10_1 differs from the display device 10 of FIG. 4 at least in that it further includes the reflective layer RL_1 as a member for guiding light emitted by light-emitting elements ED to travel in an upward direction from a first substrate SUB1. The display device 10_1 will hereinafter be described, focusing mainly on the differences with the display device 10.

The reflective layer RL_1 may be disposed on the via layer VIA. The reflective layer RL_1 may be disposed along the boundary between the via layer VIA and the first area AA1 in a plan view. The reflective layer RL_1 may have a width sufficient to overlap at least the inclined side surfaces of the via layer VIA and may surround a region in which the light-emitting elements ED are disposed, but the disclosure is not limited thereto. As another example, the reflective layer RL_1 may not surround the first area AA1, but may be disposed only on the sides, in a first direction DR1, of the region in which the light-emitting elements ED are disposed. For example, the reflective layer RL_1 may be disposed only on inclined side surfaces of the via layer VIA that extend in a second direction DR2.

The via layer VIA may be disposed to surround the first area AA1 and may have inclined side surfaces. Referring again to FIG. 6, among the beams of the first light L1 emitted upward from the light-emitting elements ED, the second sub-light L1_2 and the third sub-light L1_3 emitted from both end surfaces of each of the light-emitting elements ED may travel toward the inclined side surfaces of the via layer VIA. As the display device 10_1 further includes the reflective layer RL_1, the amount of light emitted upward can be increased by reflecting light traveling toward the inclined side surfaces of the via layer VIA.

In some embodiments, the reflective layer RL_1 may include a material with high reflectance. For example, the reflective layer RL_1 may include a material such as Ag, Cu, Al, Ni, La, or an alloy thereof, but the disclosure is not limited thereto.

A second interlayer insulating layer IL2 may be disposed below (or under) the via layer VIA, and a plurality of electrodes (RME1 and RME2) may be disposed below the second interlayer insulating layer IL2. As the reflective layer RL_1 is disposed on the via layer VIA to surround the first area AA1, the reflective layer RL_1 may overlap the electrodes (RME1 and RME2) but may not be directly connected to the electrodes (RME1 and RME2). The reflective layer RL_1 may be formed of a material with high reflectance as a separate member from the electrodes (RME1 and RME2) and conductive layers disposed in second areas BA, but the disclosure is not limited thereto. As another example, the reflective layer RL_1 and the conductive layers may be formed at the same time, in which case, the reflective layer RL_1 may be separated from the electrodes (RME1 and RME2) or the conductive layers in the second areas BA, or an insulating layer may be disposed between the reflective layer RL_1 and the electrodes (RME1 and RME2) or the conductive layers in the second areas BA.

Figure 18:
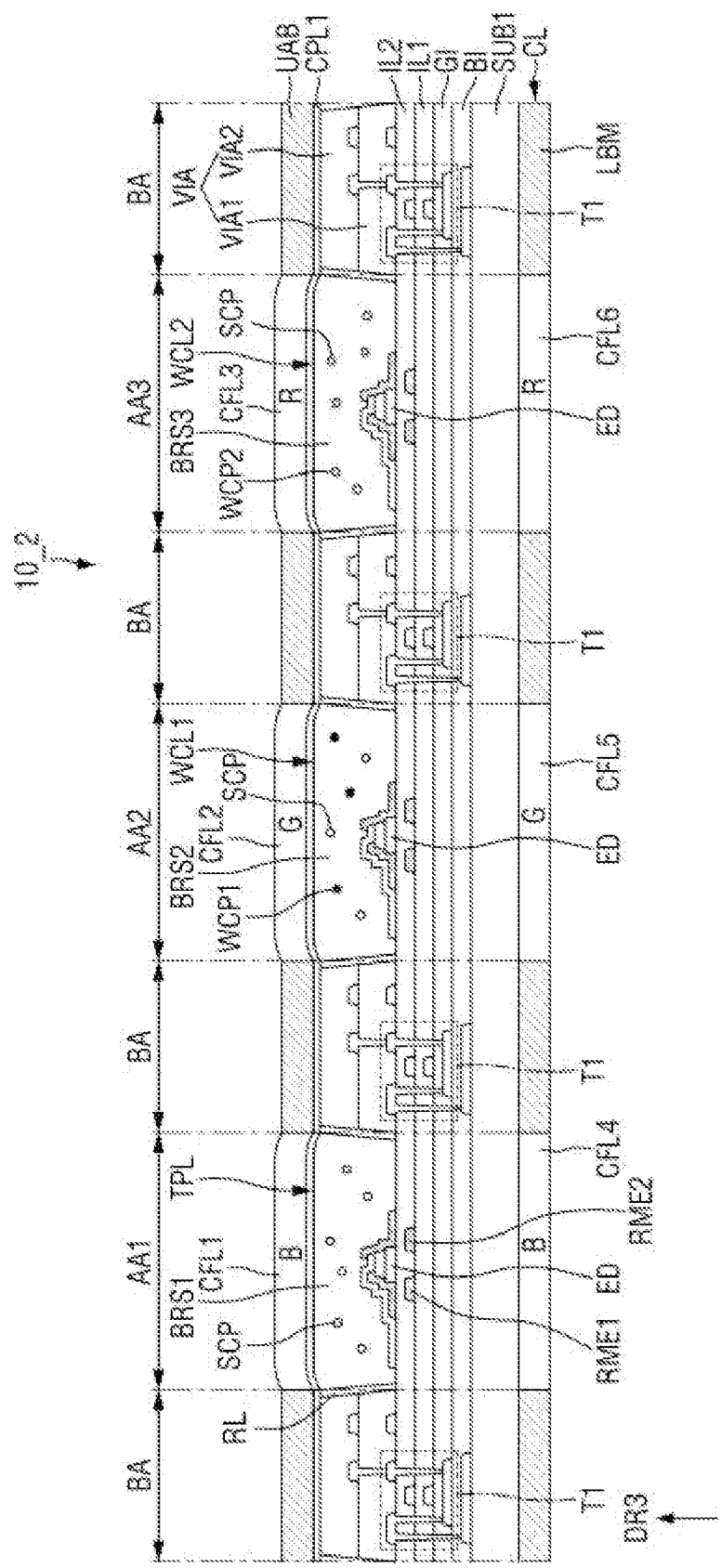
FIG. 18 is a schematic cross-sectional view of part of a pixel of a display device according to another embodiment of the disclosure.
Figure 19:
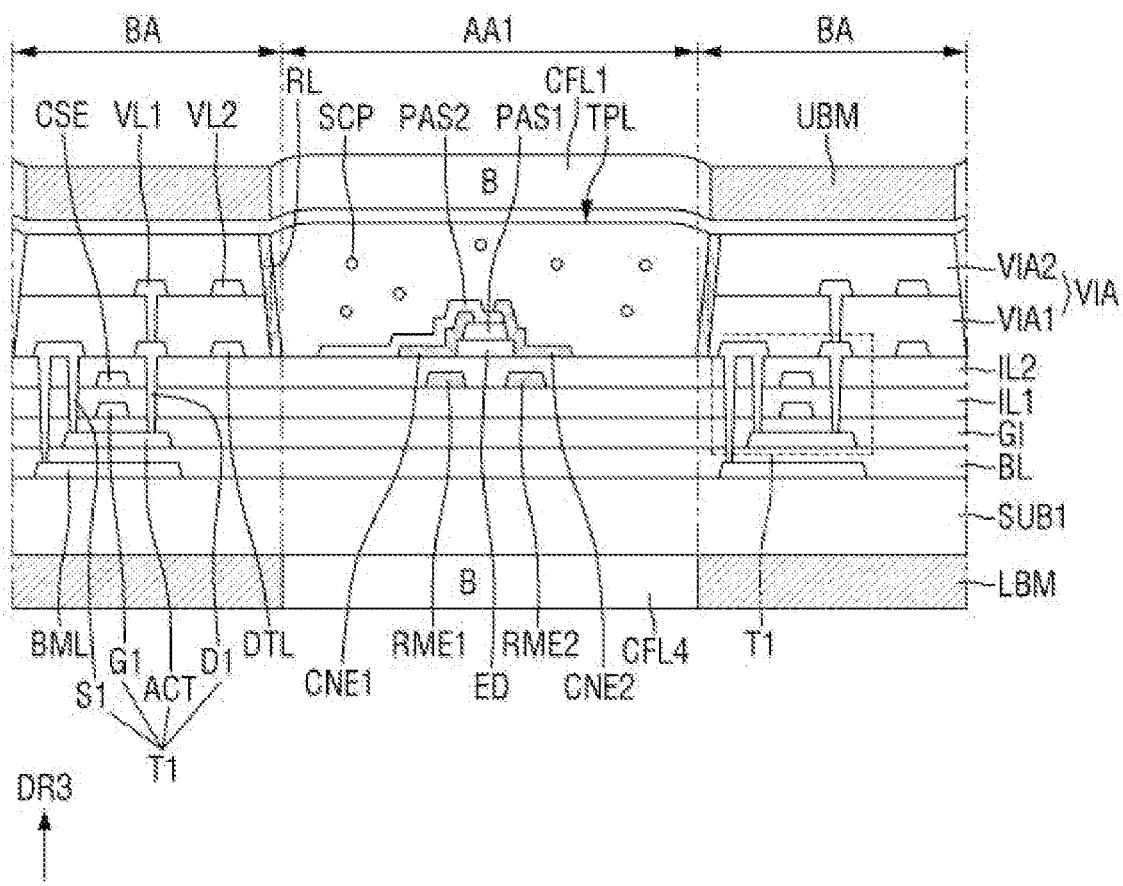
FIG. 19 is a schematic cross-sectional view of a first subpixel of FIG. 18.

FIG. 18 is a schematic cross-sectional view of portion of a pixel of a display device according to another embodiment. FIG. 19 is a schematic cross-sectional view of a first subpixel of FIG. 18. FIG. 19 illustrates a schematic cross-sectional view illustrating a first area AA1 and second areas BA of a first subpixel PX1 of FIG. 18.

Referring to FIGS. 18 and 19, a display device 10_2 may further include, in each of subpixels PXn of a pixel PX, a color control structure (TPL, WCL1, and WCL2) and color filter layers (CFL1, CFL2, CFL3, CFL4, CFL5, and CFL6). The color control structure (TPL, WCL1, and WCL2) and the color filter layers (CFL1, CFL2, CFL3, CFL4, CFL5, and CFL6) may control the color of light emitted by light-emitting elements ED. Even if each subpixel PXn includes the light-emitting elements ED of the same type, the light-emitting elements ED may emit light of different colors. Similar to the display device 10_1 of FIG. 17, the display device 10_2 may include a reflective layer RL, but unlike the display device 10_1, may further include the color control structure (TPL, WCL1, and WCL2) and the color filter layers (CFL1, CFL2, CFL3, CFL4, CFL5, and CFL6). The display device 10_2 will hereinafter be described, focusing mainly on the differences with the display device 10_1.

The color control structure (TPL, WCL1, and WCL2) may be disposed on the light-emitting elements ED. The color control structure (TPL, WCL1, and WCL2) may be disposed in first areas AA of the subpixels PXn, which are surrounded by a via layer VIA, and may receive light emitted by the light-emitting elements ED. The color control structure (TPL, WCL1, and WCL2) may not be disposed in second areas BA and a third area CA of each of the subpixels PXn, in which the light-emitting elements ED are not disposed, but the disclosure is not limited thereto. As another example, the color control structure (TPL, WCL1, and WCL2) may be disposed even in the third areas CA of the subpixels PXn.

In a case where the light-emitting elements ED emit first-color light, for example, blue light, the color control structure (TPL, WCL1, and WCL2) may include a light-transmitting layer TPL, which is disposed in the first area AA1 of the first subpixel PX1, a first wavelength conversion layer WCL1, which is disposed in a first area AA2 of a second subpixel PX2, and a second wavelength conversion layer WCL2, which is disposed in a first area AA3 of the third subpixel PX3.

The light-transmitting layer TPL may include a first base resin BRS1 and a scatterer SCP, which is disposed in the first base resin BRS1. The light-transmitting layer TPL transmits therethrough incident blue light from the light-emitting elements ED while maintaining the wavelength of the incident blue light. The scatterer SCP of the light-transmitting layer TPL may control the path of light to be emitted through the light-transmitting layer TPL. The light-transmitting layer TPL may not include a wavelength conversion material.

The first wavelength conversion layer WCL1 may include a second base resin BRS2 and a first wavelength conversion material WCP1, which is disposed in the second base resin BRS2. The second wavelength conversion layer WCL2 may include a third base resin BRS3 and a second wavelength conversion material WCP2, which is disposed in the third base resin BRS3. The first and second wavelength conversion layers WCL1 and WCL2 may transmit therethrough the incident blue light from the light-emitting elements ED after converting the wavelength of the incident blue light. Each of the first and second wavelength conversion layers WCL1 and WCP2 may further include a scatterer SCP, and the scatterers SCP of the first and second wavelength conversion layers WCL1 and WCL2 may improve the efficiency of wavelength conversion.

The scatterers SCP may be particles made of a metal oxide or particles made of an organic material. Here, the metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the organic material may be an acrylic resin or a urethane resin.

The first, second, and third base resins BRS1, BRS2, and BRS3 may include a light-transmitting organic material. For example, the first, second, and third base resins BRS1, BRS2, and BRS3 may include an epoxy resin, an acrylic resin, a cardo resin, or an imide resin. The first, second, and third base resins BRS1, BRS2, and BRS3 may include the same material, but the disclosure is not limited thereto.

The first wavelength conversion material WCP1 may convert first-color light, for example, blue light, into second-color light, for example, green light, and the second wavelength conversion material WCP2 may convert blue light into third-color light, for example, red light. The first and second wavelength conversion materials WCP1 and WCP2 may be quantum dots, quantum rods, or phosphors. The quantum dots may include group IV nanocrystals, group II-VI compound nanocrystals, group III-V compound nanocrystals, group IV-VI nanocrystals, or a combination thereof.

The color control structure (TPL, WCL1, and WCL2) may be disposed directly on a second interlayer insulating layer IL2. As the via layer VIA has a predetermined height and is disposed to surround the first areas AA of the subpixels PXn, the first, second, and third base resins BRS1, BRS2, and BRS3 of the color control structure (TPL, WCL1, and WCL2) may be disposed directly on the second interlayer insulating layer IL2, on which the light-emitting elements ED are disposed. The scatterers SCP and the first and second wavelength conversion materials WCP1 and WCP2 of the color control structure (TPL, WCL1, and WCL2) may be disposed in the first, second, and third base resins BRS1, BRS2, and BRS3, around the light-emitting elements ED.

Light-emitting elements ED of each of the subpixels PXn may emit the same blue light, but the color of light emitted from each of the first areas AA of the subpixels PXn may differ from one subpixel PXn to another subpixel PXn. For example, light emitted from light-emitting elements ED in the first area AA1 of the first subpixel PX1 may be incident upon the light-transmitting layer TPL, light emitted from light-emitting elements ED in the second area AA2 of the second subpixel PX2 may be incident upon the first wavelength conversion layer WCL1, and light emitted from light-emitting elements ED in the third area AA3 of the third subpixel PX3 may be incident upon the second wavelength conversion layer WCL2. The light incident upon the light-transmitting layer TPL may be transmitted through the light-transmitting layer TPL as blue light without being wavelength-converted, the light incident upon the first wavelength conversion layer WCL1 may be converted into green light, and the light incident upon the second wavelength conversion layer WCL2 may be converted into red light. Even if the subpixels PXn include groups of light-emitting elements ED that all emit light of the same color, the subpixels PXn may emit light of different colors depending on the arrangement of the color control structure (TPL, WCL1, and WCL2).

A first capping layer CPL1 may be disposed on the color control structure (TPL, WCL1, and WCL2). The first capping layer CPL1 may be disposed to overlap the color control structure (TPL, WCL1, and WCL2) and the via layer VIA. The first capping layer CPL1 may prevent the color control structure (TPL, WCL1, and WCL2) from being damaged or polluted by impurities, such as moisture or the air, penetrating therethrough from the outside. The first capping layer CPL1 may prevent the material of the color control structure (TPL, WCL1, and WCL2) from diffusing into other elements. The first capping layer CPL1 may be formed of an inorganic material. For example, the first capping layer CPL1 may include silicon nitride, aluminum nitride, zirconium nitride, titanium nitride, hafnium nitride, tantalum nitride, silicon oxide, aluminum oxide, titanium oxide, tin oxide, or silicon oxynitride. In some embodiments, the first capping layer CPL1 may not be provided.

The color filter layers (CFL1, CFL2, CFL3, CFL4, CFL5, and CFL6) may include a colorant such as a dye or pigment capable of absorbing light of various wavelengths other than a particular wavelength. The color filter layers (CFL1, CFL2, CFL3, CFL4, CFL5, and CFL6) may be disposed in each of the subpixels PXn and may transmit therethrough only some of light incident thereupon from each of the subpixels PXn. Each of the subpixels PXn may selectively display only light transmitted through the color filter layers (CFL1, CFL2, CFL3, CFL4, CFL5, and CFL6) thereof.

The display device 10_2 may include the color control structure (TPL, WCL1, and WCL2) and the color filter layers (CFL1, CFL2, CFL3, CFL4, CFL5, and CFL6), which are disposed on and below the color control structure (TPL, WCL1, and WCL2). Light emitted by the light-emitting elements ED may be emitted through the color control structure (TPL, WCL1, and WCL2) after having its central wavelength either maintained or converted by the color control structure (TPL, WCL1, and WCL2). Since the display device 10_2 is a double-sided light-emitting display device capable of emitting light in both an upward direction and a downward direction from a first substrate SUB1, the color filter layers (CFL1, CFL2, CFL3, CFL4, CFL5, and CFL6) of each of the subpixels PXn may be disposed on and below the first substrate SUB1. For example, first, second, and third color filter layers CFL1, CFL2, and CFL3 may be disposed on the color control structure (TPL, WCL1, and WCL2), and fourth, fifth, and sixth color filter layers CFL4, CFL5, and CFL6 may be disposed on the bottom surface of the first substrate SUB1.

The first, second, and third color filter layers CFL1, CFL2, and CFL3 may be disposed directly on the first capping layer CPL1. A first light-blocking member UBM may be further disposed on the first capping layer CPL1 to correspond to the second areas BA in which the via layer VIA is disposed.

The first light-blocking member UBM may be formed in a lattice shape to expose portions of a surface of the first capping layer CPL1. In a plan view, the first light-blocking member UBM may be disposed to surround the first areas AA of the subpixels PXn, in which the color control structure (TPL, WCL1, and WCL2) is disposed. The first light-blocking member UBM may be disposed in the second areas BA of each of the subpixels PXn to overlap the via layer VIA, but the disclosure is not limited thereto. As another example, the first light-blocking member UBM may be disposed even in the third areas CA of the subpixels PXn.

The first light-blocking member UBM may include an organic material. The first light-blocking member UBM may absorb external light and may reduce color distortion that may be caused by the reflection of external light. For example, the first light-blocking member UBM may absorb all visible light wavelengths. The first light-blocking member UBM may include a light-absorbing material. For example, the first light-blocking member UBM may be formed of a material that may be used as the black matrix of the display device 10_2.

In some embodiments, the first light-blocking member UBM may not be provided and may be replaced with a material capable of absorbing a particular visible light wavelength while transmitting other visible light wavelengths therethrough. The first light-blocking member UBM may be replaced with a color pattern that includes the same material as at least one of the first, second, and third color filter layers CFL1, CFL2, and CFL3. For example, a color pattern including the material of one of the first, second, and third color filter layers CFL1, CFL2, and CFL3 or a stack of color patterns may be disposed in a region where the first light-blocking member UBM is disposed. This will be described below in detail with reference to other embodiments.

The first, second, and third color filter layers CFL1, CFL2, and CFL3 may be disposed on portions of the first capping layer CPL1 exposed by the first light-blocking member UBM. The first, second, and third color filter layers CFL1, CFL2, and CFL3 may be spaced apart from one another with the first light-blocking member UBM interposed therebetween, but the disclosure is not limited thereto. As another example, in some embodiments, portions of the first, second, and third color filter layers CFL1, CFL2, and CFL3 may be disposed on the first light-blocking member UBM to be spaced apart from one another over the first light-blocking member UBM. As another example, in some embodiments, the first, second, and third color filter layers CFL1, CFL2, and CFL3 may partially overlap one another.

The first color filter layer CFL1 may be disposed in the first area AA1 of the first subpixel PX1, the second color filter layer CFL2 may be disposed in the first area AA2 of the second subpixel PX2, and the third color filter layer CFL3 may be disposed in the first area AA3 of the third subpixel PX3. The first, second, and third color filter layers CFL1, CFL2, and CFL3 may be formed into a similar pattern to the color control structure (TPL, WCL1, and WCL2) and may be disposed to overlap portions of emission areas of the subpixels PXn. The first, second, and third color filter layers CFL1, CFL2, and CFL3 may be disposed in the first, second, and third subpixels PX1, PX2, and PX3, respectively, to form island patterns, but the disclosure is not limited thereto. As another example, the first, second, and third color filter layers CFL1, CFL2, and CFL3 may form linear patterns over the entire surface of a display area DPA.

For example, the first color filter layer CFL1 may be a blue filter layer, the second color filter layer CFL2 may be a green filter layer, and the third color filter layer CFL3 may be a red filter layer. Among beams of light emitted by the light-emitting elements ED, light (e.g., the first light L1 of FIG. 6) traveling in an upward direction from the second interlayer insulating layer IL2 may pass through the color control structure (TPL, WCL1, and WCL2) and may be emitted through the first, second, and third color filters CFL1, CFL2, and CFL3.

The light-emitting elements ED in the first area AA1 of the first subpixel PX1 may emit first-color light, for example, blue light, and the blue light may be incident upon the light-transmitting layer TPL. The first base resin BRS1 of the light-transmitting layer TPL may be formed of a transparent material, and some of the light incident upon the light-transmitting layer TPL may be incident upon the first capping layer CPL1, which is disposed on the first base resin BRS1, through the first base resin BRS1. The light incident upon the first capping layer CPL1 may be incident upon the first color filter layer CFL1 through the first capping layer CPL1, which is formed of a transparent material, and the first color filter layer CFL1 may block the transmission of light other than blue light. As a result, the first subpixel PX1 may emit blue light.

The light-emitting elements ED in the first area AA2 of the second subpixel PX2 may also emit first-color light, for example, blue light, and the blue light may be incident upon the first wavelength conversion layer WCL1. The second base resin BRS2 of the first wavelength conversion layer WCL1 may be formed of a transparent material, and some of the light incident upon the first wavelength conversion layer WCL1 may be incident upon the first capping layer CPL1, which is disposed on the second base resin BRS2, through the second base resin BRS2. However, at least some of the light incident upon the first wavelength conversion layer WCL1 may encounter the scatterer SCP and the first wavelength conversion material WCP1 of the second base resin BRS2 to be scattered or wavelength-converted and may be incident upon the first capping layer CPL1 as green light. The light incident upon the first capping layer CPL1 may be incident upon the second color filter layer CFL2 through the first capping layer CPL1, which is formed of a transparent material, and the second color filter layer CFL2 may block the transmission of light other than green light. As a result, the second subpixel PX2 may emit green light.

Light emitted by the light-emitting elements ED in the first area AA3 of the third subpixel PX3 may be emitted as red light through the second wavelength conversion layer WCL2, the first capping layer CPL1, and the third color filter layer CFL3.

To emit only light of a particular color through the bottom surface of the first substrate SUB1, the display device 10_2 may further include a color film CL, which is disposed on the bottom surface of the first substrate SUB1. The color film CL may include the fourth, fifth, and sixth color filter layers CFL4, CFL5, and CFL6 and a second light-blocking member LBM.

The second light-blocking member LBM may have a similar arrangement to the first light-blocking member UBM. For example, the second light-blocking member LBM may be formed in a lattice shape to expose portions of the bottom surface of the first substrate SUB1. The second light-blocking member LBM may be disposed to surround the first areas AA of the subpixels PXn, in which the color control structure (TPL, WCL1, and WCL2) is disposed, in a plan view. The second light-blocking member LBM may be disposed in the second areas BA of each of the subpixels PXn to overlap the via layer VIA, but the disclosure is not limited thereto. As another example, the second light-blocking member LBM may be disposed even in the third areas CA of the subpixels PXn.

The second light-blocking member LBM and the first light-blocking member UBM may include substantially the same material. The second light-blocking member LBM may include an organic material that may be used as a black matrix. The second light-blocking member LBM may absorb external light and may reduce color distortion that may be caused by the reflection of external light.

The fourth, fifth, and sixth color filter layers CFL4, CFL5, and CFL6 may have a similar arrangement to the first, second, and third color filter layers CFL1, CFL2, and CFL3. The fourth, fifth, and sixth color filter layers CFL4, CFL5, and CFL6 may be disposed on portions of the bottom surface of the first substrate SUB1, exposed by the second light-blocking member LBM. The fourth, fifth, and sixth color filter layers CFL4, CFL5, and CFL6 may be spaced apart from one another with the second light-blocking member LBM interposed therebetween, but the disclosure is not limited thereto.

The fourth color filter layer CFL4 may be disposed in the first area AA1 of the first subpixel PX1, the fifth color filter layer CFL5 may be disposed in the first area AA2 of the second subpixel PX2, and the sixth color filter layer CFL6 may be disposed in the first area AA3 of the third subpixel PX3. The fourth, fifth, and sixth color filter layers CFL4, CFL5, and CFL6 may be disposed in the first, second, and third subpixels PX1, PX2, and PX3, respectively, to form island patterns, but the disclosure is not limited thereto. As another example, the fourth, fifth, and sixth color filter layers CFL4, CFL5, and CFL6 may form linear patterns over the entire surface of the display area DPA.

For example, the fourth color filter layer CFL4 may be a blue filter layer, the fifth color filter layer CFL5 may be a green filter layer, and the sixth color filter layer CFL6 may be a red filter layer. Among beams of light emitted by the light-emitting elements ED, light (e.g., the second light L2 of FIG. 6) traveling in a downward direction from the second interlayer insulating layer IL2 may pass through the color control structure (TPL, WCL1, and WCL2) and may then be emitted through the fourth, fifth, and sixth color filter layers CFL4, CFL5, and CFL6. Some of light emitted from the light-emitting elements ED toward the bottom surface of the first substrate SUB1 may be color-converted by the color control structure (TPL, WCL1, and WCL2), and only light of a particular color may be emitted through the fourth, fifth, and sixth color filter layers CFL4, CFL5, and CFL6.

The color control structure (TPL, WCL1, and WCL2) may be disposed in the first areas AA of the subpixels PXn, and light may be emitted from both the top surface and the bottom surface of the display device 10_2 through the color filter layers (CFL1, CFL2, CFL3, CFL4, CFL5, and CFL6) disposed on the top surface of the color control structure (TPL, WCL1, and WCL2) or on the bottom surface of the first substrate SUB1. Even if the subpixels PXn include groups of light-emitting elements ED of the same type, the subpixels PXn can emit light of different colors.

Figure 20:
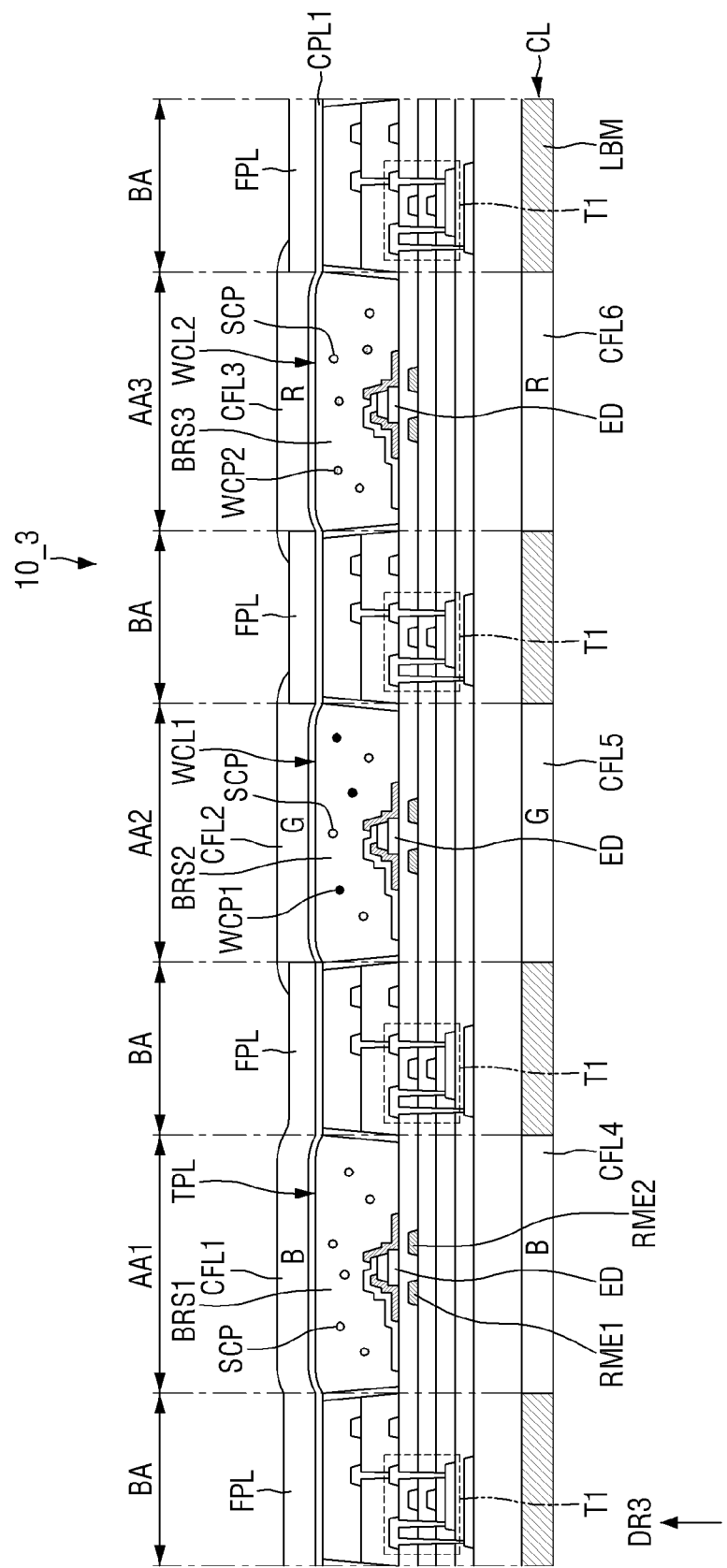
FIGS. 20 and 21 are schematic cross-sectional views of parts of pixels of display devices according to other embodiments of the disclosure.
Figure 21:
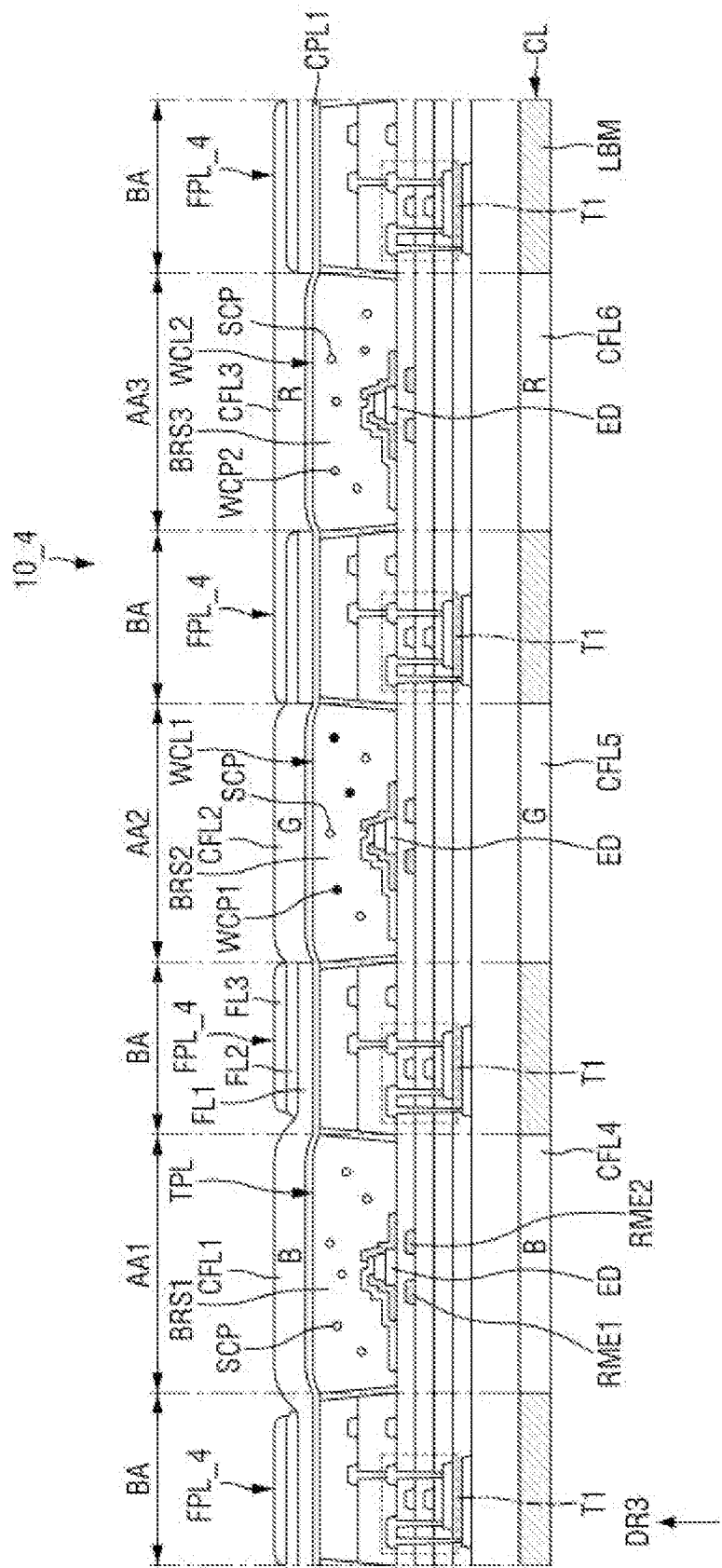

FIGS. 20 and 21 are schematic cross-sectional views of portions of pixels of display devices according to other embodiments.

Referring to a display device 10_3 of FIG. 20, a first light-blocking member UBM may not be provided, and a color pattern FPL may be disposed on a via layer VIA, in second areas BA of subpixels PXn. The display device 10_3 differs from the display device 10_2 of FIG. 19 at least in that the first light-blocking member UBM is replaced with the color pattern FPL. The display device 10_3 will hereinafter be described, focusing mainly on the differences with the display device 10_2.

The color pattern FPL may be disposed on the via layer VIA, in the second areas BA. The color pattern FPL may be formed in a lattice shape substantially identical to that of the first light-blocking member UBM of FIG. 19. The color pattern FPL and a first color filter layer CFL1 may include the same material and may be integral with each other. The first color filter layer CFL1 may be formed to have a relatively large width in second areas BA adjacent to a first area AA1 of a first subpixel PX1.

A portion of at least one of second and third color filter layers CFL2 and CFL3 may be disposed on the color pattern FPL, in second areas BA adjacent to a first area AA2 of a second subpixel PX2 and a first area AA3 of a third subpixel PX3. Each of the second and third color filter layers CFL2 and CFL3 may include a pigment of a different color from the first color filter layer CFL1 and may block the transmission of light. In a case where the first color filter layer CFL1 includes a blue colorant, external light or reflected light transmitted through the second areas BA may have a blue wavelength range. The eye color sensibility perceived by the eyes of a user varies depending on the color of light, and light in a blue wavelength range may be perceived less sensitively to the user than light in green and red wavelength ranges. As the first light-blocking member UBM is not provided, but the color pattern FPL is provided in the second areas BA, the transmission of light can be blocked, and the user can perceive reflected light less sensitively. Reflected light caused by external light can be reduced by absorbing some of the external light from the outside of the display device 10_3.

Referring to FIG. 21, a color pattern FPL_4 of a display device 10_4 may include color layers (FL1, FL2, and FL3). The display device 10_4 differs from the display device 10_3 of FIG. 20 at least in that the color pattern FPL_4 is formed of a stack of first, second, and third color layers FL1, FL2, and FL3 that include the same material as first, second, and third color filter layers CFL1, CFL2, and CFL3, respectively.

The first color layer FL1 may include the same material as the first color filter layer CFL1 and may be disposed in second areas BA of each of subpixels PXn. The first color layer FL1 may be disposed directly on a first capping layer CPL1, in the second areas BA, and may be integral with the first color filter layer CFL1, in second areas BA adjacent to a first area AA1 of a first subpixel PX1.

The second color layer FL2 may include the same material as the second color filter layer CFL2 and may be disposed in second areas BA of each of subpixels PXn. The second color layer FL2 may be integral with a second color filter layer CFL2, in second areas BA adjacent to a first area AA2 of a second subpixel PX2. Similarly, the third color layer FL3 may include the same material as the third color filter layer CFL3 and may be disposed in the second areas BA of each of subpixels PXn. The third color layer FL3 may be integral with a third color filter layer CFL3, in second areas BA adjacent to a first area AA3 of a third subpixel PX3.

As the color pattern FPL_4 has a structure in which the first, second, and third color layers FL1, FL2, and FL3 are sequentially stacked, color mixing that may be caused by materials including different colorants can be prevented between adjacent areas.

Figure 22:
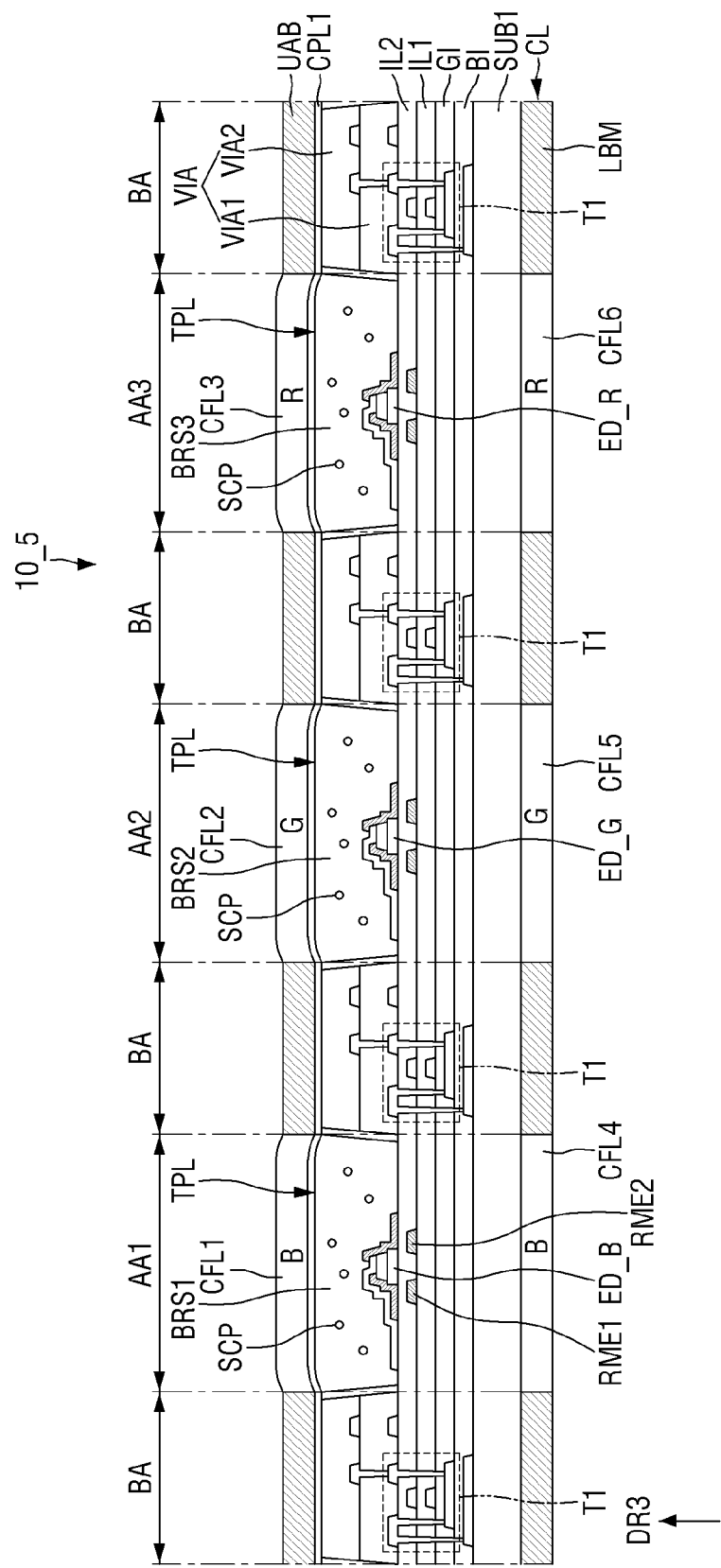
FIG. 22 is a schematic cross-sectional view of part of a pixel of a display device according to another embodiment of the disclosure.

FIG. 22 is a schematic cross-sectional view of a portion of a pixel of a display device according to another embodiment.

Referring to FIG. 22, subpixels PXn of a pixel PX of a display device 10_5 may include groups of light-emitting elements (ED_B, ED_G, and ED_R) of different types, and only light-transmitting layers TPL may be disposed in first areas AA of the subpixels PXn. Light emitted by the light-emitting elements (ED_B, ED_G, and ED_R) may be of different colors and may be output through color filter layers (CFL1, CFL2, CFL3, CFL4, CFL5, and CFL6) without having its color changed by the light-transmitting layers TPL.

For example, first light-emitting elements ED_B, which emit blue light, may be disposed in a first area AA1 of a first subpixel PX1, second light-emitting elements ED_G, which emit green light, may be disposed in a first area AA2 of a second subpixel PX2, and third light-emitting elements ED_R, which emit red light, may be disposed in a first area AA3 of a third subpixel PX3. As the light-emitting elements (ED_B, ED_G, and ED_R) emit light of different colors, the subpixels PXn can display light of different colors, even if only the light-transmitting layers TPL are disposed in the first areas AA.

Figure 23:
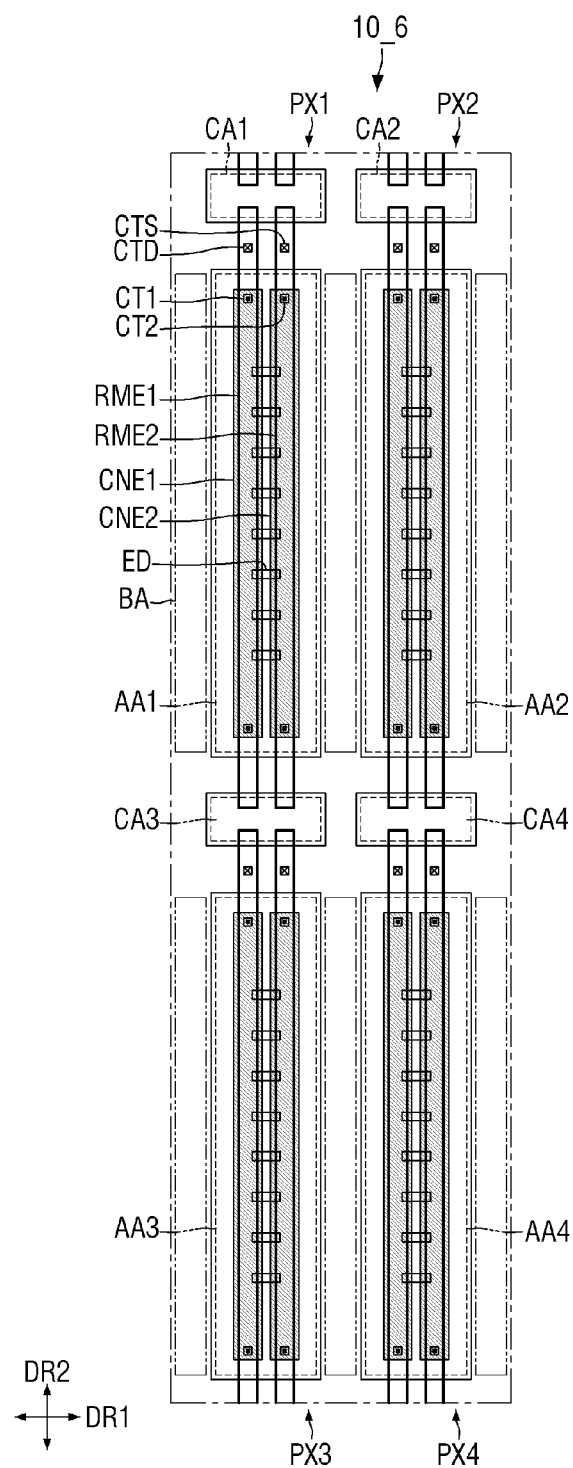
FIG. 23 is a schematic plan view of a pixel of a display device according to another embodiment of the disclosure.

FIG. 23 is a schematic plan view of a pixel of a display device according to another embodiment.

Referring to FIG. 23, each pixel PX of a display device 10_6 may include more than three subpixels PXn, and the subpixels PXn may have a different arrangement from the subpixels PXn of FIG. 2. Each pixel PX of the display device 10_6 may include first, second, and third subpixels PX1, PX2, and PX3 and may further include a fourth subpixel PX4. The first and second subpixels PX1 and PX2 may be adjacent to each other in a first direction DR1, the first and third subpixels PX1 and PX3 may be adjacent to each other in a second direction DR2, and the third and fourth subpixels PX3 and PX4 may be adjacent to each other in the first direction DR1. A via layer VIA may be disposed between subpixels PXn, and first areas AA and third areas CA of the subpixels PXn may be defined by the via layer VIA. The first areas AA may include first areas AA1, AA2, AA3, and AA4, and the third areas CA may include third areas CA1, CA2, CA3, and CA4.

The display device 10_6 of FIG. 23 differs from the display device 10 of FIG. 2 at least in that each pixel PX thereof further includes the fourth subpixel PX4. The fourth subpixel PX4 may have substantially the same structure as the first, second, and third subpixels PX1, PX2, and PX3, and light emitted from the first area AA4 of the fourth subpixel PX4 may be of a different color from light emitted from the first areas AA1, AA2, and AA3 of the first, second, and third subpixels PX1, PX2, and PX3 or may be of the same color as light emitted from one of the first areas AA1, AA2, and AA3 of the first, second, and third subpixels PX1, PX2, and PX3. If the amount of light emitted by one of the first, second, and third subpixels PX1, PX2, and PX3 is small, the fourth subpixel PX4 may increase the amount of light emitted by the corresponding subpixel PXn by emitting light of the same color as or a different color from the corresponding subpixel PXn. The rest of the structure of the display device 10_6 may be substantially identical to those described above, and thus, detailed descriptions thereof will be omitted.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a substrate including a plurality of first areas and a plurality of second areas, at least one of the plurality of second areas being disposed between adjacent ones of the plurality of first areas;
   active layers disposed on the substrate in the plurality of second areas;
   a first conductive layer including first gate electrodes which are disposed on the active layers;
   a first interlayer insulating layer disposed on the first conductive layer and the substrate;
   a second conductive layer including a first electrode and a second electrode which are disposed in each of the plurality of first areas and are spaced apart from each other;
   a second interlayer insulating layer disposed on the second conductive layer and the first interlayer insulating layer;
   a third conductive layer including source electrodes and drain electrodes which are disposed on the second interlayer insulating layer in the plurality of second areas;
   a via layer disposed on the third conductive layer in the plurality of second areas and exposing the plurality of first areas; and
   a plurality of light-emitting elements disposed on the second interlayer insulating layer in each of the plurality of first areas, each of the plurality of light-emitting elements including end portions disposed on the first and second electrodes.

2. The display device of claim 1, wherein
   the via layer surrounds the plurality of first areas, and
   the plurality of light-emitting elements do not overlap portions of the first and third conductive layers in the plurality of second areas in a thickness direction of the substrate.

3. The display device of claim 2, further comprising:
   a reflective layer disposed on side surfaces of the via layer and surrounding the plurality of first areas.

4. The display device of claim 3, wherein the reflective layer is disposed on the second interlayer insulating layer and is not electrically connected to the first and second electrodes.

5. The display device of claim 2, further comprising:
   a first contact electrode electrically contacting the first electrode and first end portions of the plurality of light-emitting elements; and
   a second contact electrode electrically contacting the second electrode and second end portions of the plurality of light-emitting elements,
   wherein the first and second contact electrodes are disposed on the second interlayer insulating layer in each of the plurality of first areas.

6. The display device of claim 5, wherein
the first contact electrode is formed in each of the plurality of first areas and electrically contacts the first electrode through a first contact hole that penetrates the second interlayer insulating layer, and
the second contact electrode is formed in each of the plurality of first areas and electrically contacts the second electrode through a second contact hole that penetrates the second interlayer insulating layer.

7. The display device of claim 5, further comprising:
a first insulating layer disposed on the plurality of light-emitting elements and exposing both end portions of each of the plurality of light-emitting elements; and
a second insulating layer disposed on the first contact electrode, wherein
a first side of the first contact electrode is disposed directly on the first insulating layer, and
a first side of the second contact electrode is disposed directly on the second insulating layer.

8. The display device of claim 2, wherein the second conductive layer includes capacitive electrodes which are disposed in the plurality of second areas and overlap the first gate electrodes in the thickness direction of the substrate.

9. The display device of claim 2, wherein
the via layer includes:
a first via layer which is disposed directly on the second interlayer insulating layer; and
a second via layer which is disposed on the first via layer, and
the display device further comprises a fourth conductive layer, the fourth conductive layer including:
first voltage lines which are disposed on the first via layer and are electrically connected to the first electrode; and
second voltage lines which are electrically connected to the second electrode.

10. The display device of claim 9, wherein
the first electrode electrically contacts a first conductive pattern which is disposed in the third conductive layer and is electrically connected to the source electrodes through a first electrode contact hole that penetrates the second interlayer insulating layer, and
the second electrode electrically contacts a second conductive pattern which is disposed in the third conductive layer and is electrically connected to the second voltage lines through a second electrode contact hole that penetrates the second interlayer insulating layer.

11. The display device of claim 2, further comprising:
a plurality of color control structures disposed on the plurality of light-emitting elements in different plurality of first areas,
wherein each of the plurality of color control structures includes:
a light-transmitting layer which is disposed in one of the plurality of first areas; and
a first wavelength conversion layer which is disposed in another first area adjacent to the first area in which the light-transmitting layer is disposed.

12. The display device of claim 11, further comprising:
a first color filter layer disposed on the light-transmitting layer;
a second color filter layer disposed on the first wavelength conversion layer and spaced apart from the first color filter layer; and
a first light-blocking member disposed on the via layer in the plurality of second areas.

13. The display device of claim 12, wherein
each of the plurality of color control structures includes a second wavelength conversion layer which is disposed in the another first area adjacent to the first area where the first wavelength conversion layer is disposed, and
the display device further comprises a third color filter layer which is disposed on the second wavelength conversion layer.

14. The display device of claim 13, further comprising:
a color film disposed on a bottom surface of the substrate, wherein the color filter includes:
a fourth color filter layer which is disposed in the first area where the light-transmitting layer is disposed;
a fifth color filter layer which is disposed in the first area where the first wavelength conversion layer is disposed; and
a sixth color filter layer which is disposed in the first area where the second wavelength conversion layer is disposed.

15. The display device of claim 2, wherein
the plurality of light-emitting elements include:
first light-emitting elements which are disposed in one of the plurality of first areas; and
second light-emitting elements which are disposed in another first area adjacent to the first area where the first light-emitting elements are disposed, and
the first light-emitting elements and the second light-emitting elements emit light of different colors.

16. A display device comprising:
a substrate;
a via layer disposed on the substrate extending in a first direction and a second direction which intersects the first direction, and surrounding a plurality of first areas;
first transistors disposed in a plurality of second areas in which the via layer is disposed;
a first electrode and a second electrode disposed in each of the plurality of first areas, extending in the second direction, and spaced apart from each other in the first direction;
a plurality of light-emitting elements disposed on the first and second electrodes;
a first contact electrode disposed on the first electrode and electrically contacting first end portions of the plurality of light-emitting elements;
a second contact electrode disposed on the second electrode and electrically contacting second end portions of the plurality of light-emitting elements; and
a reflective layer surrounding the plurality of first areas and disposed on inner sides of the via layer.

17. The display device of claim 16, wherein the plurality of light-emitting elements do not overlap the first transistors which are disposed in the plurality of second areas in a thickness direction of the substrate.

18. The display device of claim 17, further comprising:
first voltage lines and second voltage lines disposed in the plurality of second areas,
wherein the first and second electrodes do not overlap the first voltage lines and the second voltage lines in the thickness direction of the substrate.

19. The display device of claim 17, further comprising:
a color control structure disposed in each of the plurality of first areas and overlapping the plurality of light-emitting elements, the color control structure including:
a light-transmitting layer which is disposed in one of the plurality of first areas; and a first wavelength conversion layer which is disposed in another first area adjacent to the first area where the light-transmitting layer is disposed.

20. The display device of claim 17, further comprising:
third areas spaced apart from the plurality of first areas in the second direction and surrounded by the via layer, wherein
the first and second electrodes extend in the second direction and are disposed in portion in the third areas, and
the plurality of light-emitting elements are not disposed in the third areas.

\* \* \* \* \*